US011247903B2

(12) United States Patent
Moriguchi et al.

(10) Patent No.: US 11,247,903 B2
(45) Date of Patent: Feb. 15, 2022

(54) COATING FILM, METHOD FOR MANUFACTURING SAME, AND PVD APPARATUS

(71) Applicant: NIPPON ITF, INC., Kyoto (JP)

(72) Inventors: Hideki Moriguchi, Kyoto (JP);
Akinori Shibata, Kyoto (JP)

(73) Assignee: NIPPON ITF, INC., Kyoto (JP)

( * ) Notice: Subject to any disclaimer, the term of this patent is extended or adjusted under 35 U.S.C. 154(b) by 495 days.

(21) Appl. No.: 16/087,088

(22) PCT Filed: Mar. 2, 2017

(86) PCT No.: PCT/JP2017/008358
§ 371 (c)(1),
(2) Date: Sep. 20, 2018

(87) PCT Pub. No.: WO2017/163807
PCT Pub. Date: Sep. 28, 2017

(65) Prior Publication Data
US 2019/0100434 A1   Apr. 4, 2019

(30) Foreign Application Priority Data
Mar. 23, 2016 (JP) .............................. JP2016-059233

(51) Int. Cl.
*B32B 9/00* (2006.01)
*C01B 32/05* (2017.01)
(Continued)

(52) U.S. Cl.
CPC .............. *C01B 32/05* (2017.08); *C01B 32/15* (2017.08); *C23C 14/0605* (2013.01);
(Continued)

(58) Field of Classification Search
USPC ....................................................... 428/408
See application file for complete search history.

(56) References Cited

U.S. PATENT DOCUMENTS 7,977,255 B1 * 7/2011 Scheer ................ H01L 21/0214
438/776
9,534,476 B2 * 1/2017 Kumar ................... C09K 8/528

FOREIGN PATENT DOCUMENTS

| CN | 1291809 | 12/2006 |
|----|---------|---------|
| CN | 1922338 | 2/2007 |

(Continued)

OTHER PUBLICATIONS

"Office Action of China Counterpart Application", dated Jun. 23, 2020, with English translation thereof, pp. 1-10.
(Continued)

*Primary Examiner* — Daniel H Miller
(74) *Attorney, Agent, or Firm* — JCIPRNET

(57) ABSTRACT

Provided is a physical vapor deposition (PVD) method in which a thick, hard carbon film having excellent durability can be formed, and chipping resistance and wear resistance can bot be achieved while improving the low friction properties and peeling resistance of the formed hard carbon film. Provided is a coating film having a total film thickness of greater than 1 µm and less than or equal to 50 µm, wherein, when observed using a bright field TEM image, the cross section of the coating film is revealed to consist of relatively white hard carbon layers and relatively black hard carbon layers alternately stacked in the thickness direction, and the white hard carbon layers have a region having a columns-shape, which has grown in the thickness direction.

14 Claims, 5 Drawing Sheets

(51) Int. Cl.
*C23C 14/32* (2006.01)
*C23C 14/54* (2006.01)
*C23C 14/50* (2006.01)
*C23C 14/06* (2006.01)
*C01B 32/15* (2017.01)

(52) U.S. Cl.
CPC .......... *C23C 14/0611* (2013.01); *C23C 14/32* (2013.01); *C23C 14/325* (2013.01); *C23C 14/505* (2013.01); *C23C 14/54* (2013.01); *C23C 14/541* (2013.01); *B32B 9/007* (2013.01); *Y10T 428/30* (2015.01)

(56) References Cited

FOREIGN PATENT DOCUMENTS

| | | |
|---|---|---|
| CN | 101341274 | 1/2009 |
| CN | 101432462 | 5/2009 |
| CN | 103080003 | 5/2013 |
| CN | 108368602 | 8/2018 |
| JP | H1087396 | 4/1998 |
| JP | 2001261318 | 9/2001 |
| JP | 2002322555 | 11/2002 |
| JP | 2002327271 | 11/2002 |
| JP | 2007169698 | 7/2007 |
| JP | 2009504448 | 2/2009 |
| JP | 2009184859 | 8/2009 |
| JP | 2010287542 | 12/2010 |
| JP | 2011148686 | 8/2011 |
| JP | 4918656 | 4/2012 |
| JP | 2013528697 | 7/2013 |
| WO | 2005083144 | 9/2005 |
| WO | 2012063735 | 5/2012 |

OTHER PUBLICATIONS

"International Search Report (Form PCT/ISA/210) of PCT/JP2017/008358," dated Jun. 6, 2017, with English translation thereof, pp. 1-4.

"Office Action of China Counterpart Application," with English translation thereof, dated Nov. 1, 2019, p. 1-p. 12.

"Office Action of India Counterpart Application," dated Oct. 18, 2019, p. 1-p. 4.

\* cited by examiner

COATING FILM, METHOD FOR MANUFACTURING SAME, AND PVD APPARATUS

CROSS-REFERENCE TO RELATED APPLICATION

This application is a 371 of international application of PCT application serial no. PCT/JP2017/008358, filed on Mar. 2, 2017, which claims the priority benefit of Japan application no. 2016-059233, filed on Mar. 23, 2016. The entirety of each of the abovementioned patent applications is hereby incorporated by reference herein and made a part of this specification.

BACKGROUND OF THE INVENTION

Technical Field

The present invention relates to a coating film, a manufacturing method for the same, and a Physical Vapor Deposition (PVD) apparatus, in particular, to a suitable coating film serving as coating films of various sliding members, a manufacturing method for the same, and a PVD apparatus used in the manufacturing method.

Related Art

In recent years, in various industrial fields, especially in the field of automobile, the study of forming hard carbon films serving as coating films to surfaces of members requiring slidability such as engine substrates or other mechanical substrates is prevalent.

The hard carbon film is generally called with various names such as Diamond Like Carbon (DLC) film, amorphous carbon film, i-carbon film, diamond-like carbon film, which is not structurally crystalline and is classified as amorphous.

Moreover, regarding the hard carbon film, it is generally considered that single bonds as seen in diamond crystals and double bonds as seen in graphite crystals are coexisted, in addition to having high hardness, high wear resistance, excellent chemical stability and other characteristics like the diamond crystals, also has low hardness, high lubricity, excellent object adaptability and other characteristics like the graphite crystals. In addition, as it is amorphous, it has excellent flatness and also has low friction when in direct contact with an object material, that is, small friction coefficient or excellent object adaptability.

The characteristics vary significantly depending on a film-forming condition, a sliding condition, and an object material, and a technology that improves those characteristics by controlling the composition, structure, surface roughness of the hard carbon film has been put forward.

On the other hand, chipping resistance (defect resistance) and wear resistance which are important characteristics for the coating film coated on the sliding member are in a trade-off relation, and thus it is difficult to balance these characteristics.

Therefore, the balance of chipping resistance and wear resistance of the coating film of the sliding member is sought by specifying a hard carbon film upon low hardness, or specifying a coexisted existence state of low hardness hard carbon and high-hardness hard carbon, or effectively utilizing low-hardness hard carbon, thereby improving the trade-off relation.

However, the present situation is still insufficient to have the chipping resistance and the wear resistance both ways. Also, for the coating film of the sliding member, in addition to the chipping resistance or the wear resistance, low-friction properties or peeling resistance is further required, but the present situation is that improvement of these characteristics is still insufficient.

For example, patent literature 1 shows that, by alternately stacking a low-hardness hard carbon layer and a high-hardness hard carbon layer, chipping resistance and wear resistance are balanced, but the balance is still insufficient, and low friction properties or the peeling resistance is insufficient due to an increase in the wear amount when the film thickness of the low-hardness carbon layer exceeds 30 nm; the low-hardness hard carbon layer is an amorphous structure that uses carbon as a main component, and contains a graphite cluster formed by a mean diameter of above 2 nm, and the high-hardness hard carbon layer contains a graphite cluster formed by a mean diameter of below 1 nm.

Besides, patent literature 2 discloses a hard carbon film formed using a plasma Chemical Vapor Deposition (CVD) method that uses carbon and hydrogen as main components and has a surface roughness of Rmax below 0.5 μm, which is an amorphous structure in X-ray diffraction crystallography. As a mixture of clusters of a diamond structure and a graphite structure, chipping resistance and wear resistance are balanced by specifying the numbers of carbon atoms of each cluster; however, to prevent abnormal growth from reducing surface roughness, two clusters of a diamond structure and a graphite structure are required, the number of atoms of each cluster is substantially 100-2000, and thus, even if it is an amorphous structure in the X-ray diffraction, it sometimes also contains crystalline substances if tiny areas are analyzed with electron beam diffraction, the cluster is big in size and is limited in the balance of chipping resistance and wear resistance, and low friction properties or peeling resistance is insufficient.

Besides, patent literature 3 discloses a metal member formed by at least configuring a DLC film on an iron-containing metal substrate, and the DLC film, in Raman spectroscopy, has a peak derived from graphite which is observed in a range of a wave number of 1550-1600 $cm^{-1}$. There are multiple different intensities of the peak mixed in a film surface, a difference between the maximum and minimum peak intensities is more than one digit, and it is shown that, by locally making a high-hardness DLC film and an excellent-lubricity DLC film separately within the same film surface, a film that combines DLC films with different hardness is made in the same surface, to balance chipping resistance and wear resistance, but the sizes of the excellent-hardness DLC film and excellent-lubricity DLC film in the surface are up to dozens of microns (μm), and thus poor performance caused by parts is easy to occur, and it is difficult to balance chipping resistance and wear resistance uniformly in a sliding surface.

In addition, patent literature 4 discloses a hard carbon film having a structure that at least one part of $sp^2$ bonding crystals is successively connected in a film thickness direction. However, in the structure that at least one part of the $sp^2$ bonding crystals is successively connected in the film thickness direction, electrical conductivity is excellent, but slip surface of the $sp^2$ bonding crystals has an angle relative to the sliding surface, and low friction property which utilizing the slip surface of the $sp^2$ bonding crystals is suppressed. Furthermore, in order to make the hard carbon film with such a structure contain crystalline substances, the energy of carbon ions reaching the substrate has to be increased, and the bias voltage during film-forming is reduced to −400 to −1000 V. However, under such a film-forming condition, the film formed has low hardness and poor wear resistance. Therefore, even if it is suitable to serve as a conductive member, it cannot be used as a coating film of a sliding member requiring excellent wear resistance.

In addition, patent literature 5 discloses a nitrogen-containing alignment DLC film in which the amount of carbon having an $sp^2$ hybridized orbital is above 70 atom % and a graphite (002) surface is aligned along a thickness direction, but during film-forming, nitrogen is used in plasma CVD, and the bias voltage is very low to be below −1500 V. Therefore, carbon atoms having an $sp^2$ hybridized orbital is above 70% and the $sp^2/sp^3$ ratio becomes very great to be 2.3-∞, only a hard carbon film with low hardness and poor wear resistance can be obtained, but it still cannot be used as a coating film of the sliding member.

Furthermore, patent literature 6 proposes a DLC film for piston ring which has a thickness of at least 10 μm and contains a ta-c type DLC not containing hydrogen with an $sp^3$ ratio of at least 40 atom %, and by doping B, O, Si, the $sp^3$ ratio in the outer side 1-3 μm of the ta-c type DLC film is reduced, which has excellent friction during leveling, improves heat resistance under inadequate lubrication environments, and has an effect of inhibiting remains, but still does not sufficiently balance chipping resistance and wear resistance.

PRIOR ART DOCUMENT

Patent Document

Patent document 1: Japanese Patent Publication Gazette No. 2001-261318
Patent document 2: Japanese Patent Publication Gazette No. H10-87396
Patent document 3: Japanese Patent Publication Gazette No. 2009-184859
Patent document 4: Japanese Patent Publication Gazette No. 2002-327271
Patent document 5: Japanese Patent Publication Gazette No. 2011-148686
Patent document 6: Japanese Patent Publication Gazette No. 2013-528697

SUMMARY

Problems to be Solved

Conventionally, a method for forming a hard carbon film by CVD is known, but the technologies using CVD are insufficient in balancing chipping resistance and wear resistance, and are also insufficient in improving low friction or peeling resistance.

That is, in the film-forming method using CVD, the film-forming temperature is high, and hydrogen-containing gas raw material is used, therefore the formed hard carbon film contains hydrogen. Such a hard carbon film has low hardness and excellent chipping resistance, and has excellent durability because thick film can be easily formed, but wear resistance is insufficient due to low hardness. Besides, because the formed hard carbon film contains hydrogen, low friction property in oil is poorer than hard carbon films formed by PVD.

Therefore, inventors of the present invention consider forming a hard carbon film using PVD instead of the abovementioned CVD. PVD uses solid carbon as a raw material in a cathode, and has merits that a hydrogen content in the hard carbon film can be set to below 10 atom %, and hard carbon which has high hardness not containing hydrogen or impurity metal and excellent low friction property in oil can be formed into a film.

When PVD is used to form a hard carbon film serving as a coating film of the sliding member, it is difficult to generate $sp^3$ bonding carbon (diamond structure) if the substrate temperature is high, and a hard carbon film rich in $sp^2$ bonding carbon (graphite structure), that is, a low-hardness hard carbon film is formed; therefore, the substrate temperature is controlled below 200° C. to form the film and a hard carbon film with high ratio of $sp^3$ bonding carbon and excellent wear resistance is formed.

However, when forming a hard carbon film using PVD in the way mentioned above, if thick hard carbon film is to be formed to ensure sufficient durability and prolong service life, compressive residual stress in the hard carbon film becomes excessively great and the film destructs itself when the film thickness is above 1 μm. Even if the film is not self-destructed, in a state in which the compressive residual stress is great and strain is accumulated, chipping resistance is low. As a result, in PVD, it is difficult to form a thick hard carbon film in a stabilized way, and it is difficult to ensure sufficient durability.

Therefore, the purpose of the present invention is to provide a technology, which, addition to being capable of forming thick hard carbon films of excellent durability even using PVD, is able to balance chipping resistance and wear resistance in the formed hard carbon film and able to improve low friction property and peeling resistance.

Means of Solving the Problems

The inventor carries out various experiments and researches to solve the problem, and, instead of being limited to the conventional idea of controlling the substrate temperature below 200° C. in the PVD, uses PVD method and increases the substrate temperature in the formation of the hard carbon film. As a result, when the hard carbon film is formed under conditions of a substrate temperature of above 250° C. and a bias voltage of below −275 V, a thick hard carbon film with a completely new structure is formed.

However, the hard carbon film forming at such a high temperature has a relatively high ratio of $sp^2$ structure to $sp^3$ structure (also referred to as "$sp^2/sp^3$ ratio" hereinafter) and low hardness, so that although chipping resistance is excellent, wear resistance is insufficient.

Therefore, the inventor goes on carrying out various researches and considers alternately stacking a hard carbon layer which is formed at a low temperature below 250° C. and has a low $sp^2/sp^3$ ratio and a columns-shaped hard carbon layer which is formed at a high temperature above 250° C. and has a relatively high $sp^2/sp^3$ ratio; experiments are carried out with such a film-forming method, and as a result, a hard carbon film serving as a coating film of a sliding member, which not only has a film thickness over 1 μm but also balances chipping resistance and wear resistance, is successfully formed. Furthermore, when this film-forming method is used, a result surprising the inventor is obtained, that is, not only the chipping resistance and wear resistance are improved, low friction property and peeling resistance are also improved.

Specifically, by observing a bright-field Transmission Electron Microscope (TEM) image of a cross-section of the hard carbon film obtained by said film-forming method, under a condition usually used in the bright-field TEM, that is, an acceleration voltage of 200-300 kV, a result is obtained that hard carbon layers are formed in which black hard carbon layers and white hard carbon layers are alternately laminated, and the white hard carbon layers grow on the black hard carbon layers in a columns-shape in a thickness direction of the film.

Moreover, by measuring sliding characteristics of the hard carbon film, a result is obtained that not only is the balance of chipping resistance and wear resistance originally in the trade-off relation improved more than before, but low friction properties or peeling resistance is also sufficiently improved. That is, the hard carbon film obtained by the above film-forming method has characteristics of being extremely suitable as a coating film coated on the surface of a member requiring slidability. Furthermore, as mentioned above, by repeating film formation at a temperature above 250° C. during the film forming, thick film can be formed and durability can be improved even if PVD is used.

It is considered that the reasons for achieving such an effect are as follows.

That is, it is displayed in the bright-field TEM image that the relatively-white hard carbon layers are of low density, and the $sp^2/sp^3$ ratio is high. On the other hand, it is displayed that the relatively-black hard carbon layers are of high density, and the $sp^2/sp^3$ ratio is low. Moreover, as mentioned above, the white hard carbon layers having a great $sp^2/sp^3$ ratio have insufficient wear resistance due to low hardness, but have excellent chipping resistance, and the black hard carbon layers having a small $sp^2/sp^3$ ratio have excellent wear resistance.

Besides, in the present invention, the columns-shaped white hard carbon layers with excellent chipping resistance and the black hard carbon layers with excellent wear resistance are alternately laminated. For this reason, the hard carbon film in which the white hard carbon layers and the black hard carbon layers are alternately laminated becomes a coating film with excellent characteristics of both sides, and can sufficiently improve the balance of chipping resistance and wear resistance.

In the bright-filed TEM image, the white hard carbon layers of the present invention display columns-shaped structures and has relatively black parts and relatively white parts, and the white and black in the columns-shaped hard carbon layers are considered to represent a density difference or a slight orientation difference. That is, when density difference is represented, the white parts are considered to be low-density parts, and the black parts are considered to be high-density parts; when a slight orientation difference is represented, the columns-shaped hard carbon layers have structures that (002) surfaces are in parallel with the substrate and a c-axis grows perpendicular to the substrate, and grow in a shape that each column of the columns-shaped structures rotates little by little. It is considered that the existence of color difference in the bright-filed TEM image is caused by the orientation difference. Besides, it is considered that the columns-shaped hard carbon layers represent graphite crystals having diffraction spots in positions of 0.3-0.4 nm in an electron beam diffraction.

The columns-shaped hard carbons grow in the thickness direction while maintaining a fine grain size and have a large aspect ratio. The fine columns-shaped structures having a large aspect ratio are extremely excellent in strength, and thus not only low friction property but also chipping resistance can be improved. Besides, because the columns-shaped hard carbon structures are resistant to peeling in the thickness direction, excellent peeling resistance can be exhibited.

As a result, when such a hard carbon film is coated on the surface of a member requiring slidability, compared with the situation in which the existing hard carbon film is coated, low friction property, chipping resistance, and peeling resistance can be greatly increased.

Moreover, it is preferable that the hard carbons for which the film grows into a columns-shape in a direction perpendicular to the substrate in the abovementioned manner form the film using PVD method.

That is, conventionally, it is known that hard carbon can be formed into a film even by CVD method, but the CVD method is not a suitable film-forming method to form high-density hard carbons. As a result of the researches, the inventor of the present invention discovers that a hard carbon film having the abovementioned structure can be formed by using PVD method and appropriately controlling the film-forming temperature.

In addition, because hydrogen-containing gas material is used in CVD method, the hardness of the film easily decreases, and low friction property in oil is also poor; however, because solid carbon is used in the cathode in PVD method as raw material, there is a merit that hard carbon which has high hardness not containing hydrogen or impurity metal and excellent low friction property in oil can be formed into a film.

Besides, when the columns-shaped hard carbon layers are measured by Raman spectroscopy, if an ID/IG ratio, which is an area intensity ratio of peaks of D band and G band in a Raman spectroscopic spectrum, is too large, wear resistance easily decreases; on the other hand, if the ID/IG ratio is too small, the effect of chipping resistance improvement is insufficient. As a result of the researches, the present invention discovers that the ID/IG ratio is preferably 1-7, particularly preferably 1.5-6. Being controlling the ID/IG ratio to this range, wear resistance and chipping resistance can be sufficiently balanced.

As mentioned above, when the hard carbon film obtained by the above film-forming method is coated on the surface of a member requiring slidability, compared with the situation in which the existing hard carbon film is coated, chipping resistance and wear resistance can be balanced, and low friction properties and peeling resistance can be improved. Besides, durability can also be improved since thick film can be obtained.

The invention recited in technical solution 1, based on the understanding, is a coating film,
  coated on a substrate surface, wherein
  when observing a cross-section through a bright-filed TEM image, white hard carbon layers shown as relatively white and black hard carbon layers shown as black are alternately laminated in a thickness direction to have a total film thickness ranging from 1 μm to 50 μm, and
  the white hard carbon layers have regions that are grown in a columns-shape in the thickness direction.

According to the technical solution of the invention, a coating film can be provided which, as described above, in addition to balancing chipping resistance and wear resistance, is able to improve low friction property or peeling resistance and improve durability by thicker film because the white hard carbon layers with excellent chipping resistance and the black hard carbon layers with excellent wear resistance are alternately laminated.

In the technical solution of the invention, the specific film thickness ranges from 1 μm to 50 μm in the form of total film thickness. When the total film thickness is excessively thin as below 1 μm, as mentioned above, durability cannot be sufficiently ensured. On the other hand, when the total film thickness is excessively thick as above 50 μm, the film-forming time becomes long and it is industrially unrealistic. The thickness is more preferably ranging from 1 μm to 30 μm.

In addition, the layer number of the black hard carbon layers and the white hard carbon layers is not limited in particular and is suitably set based on the total film thickness of the coating film, the thickness of each hard carbon layer and so on; however, it is preferable to alternately laminate more than two layers respectively to ensure sufficient durability. For example, a coating film, which has a total film thickness of about 10 μm and in which respectively 20 layers of the black hard carbon layers and the white hard carbon layers are laminated, can be set as a preferred example.

Besides, the substrate temperature is set to 250° C. to 400° C. when forming the columns-shaped white hard carbon layers, and in order to form suitable columns-shaped white hard carbon layers, the substrate temperature is more preferably set to 250° C. to 350° C.

On the other hand, the substrate temperature is set to below 250° C. when forming the amorphous black hard carbon layers, and in order to form suitable black hard carbon layers, the substrate temperature is preferably below 225° C. However, when the hard carbon film is formed under the condition that the substrate temperature increases continuously, the black hard carbon layers and the white hard carbon layers can also be continuously formed at a temperature range of 50° C. to 400° C.

The invention recited in technical solution 2 is the coating film according to technical solution 1, wherein
when observing the cross-section through the bright-filed TEM image, an adhesion layer including relatively-white hard carbon is further included between the white hard carbon layer shown as relatively white and the black hard carbon layer shown as black.

The invention recited in the technical solution is preferable because the adhesion between the white hard carbon layers and the black hard carbon layers is improved by forming adhesion layers including white hard carbon.

The invention recited in technical solution 3 is the coating film according to technical solution 1 or technical solution 2, wherein
the $sp^2/sp^3$ ratio of the adhesion layer including white hard carbon is 0.4-0.9.

The invention of the technical solution is preferable because when the $sp^2/sp^3$ ratio of the adhesion layer including white hard carbon is 0.4-0.9, excellent performance of the adhesion layer is exhibited.

The invention recited in technical solution 4 is the coating film according to any one of technical solution 1 to technical solution 3, wherein
the $sp^2/sp^3$ ratio of the black hard carbon layers is 0.1-0.45.

In the technical solution of the invention, the $sp^2/sp^3$ ratio of the black hard carbon layers is preferably 0.1-0.45. That is, in the black hard carbon layers, when the $sp^2/sp^3$ ratio is below 0.1, the $sp^2/sp^3$ ratio is too low and chipping resistance is extremely low, and when the $sp^2/sp^3$ ratio is above 0.45, the $sp^2/sp^3$ ratio is too high and wear resistance cannot be ensured.

Besides, in recent years, there is a tendency that low-viscosity oil such as 0W16 or oil with Mo-DTC (Molybdenum Dithio-Carbamate) added is applied to sliding device such as engine oil of a vehicle. In such oil, if the hard carbon layers are rich in $sp^a$, specifically, if the $sp^2/sp^3$ ratio is not below 0.45, sufficient wear resistance cannot be ensured; however, in the technical solution of the invention, the $sp^2/sp^3$ ratio of the black hard carbon layer is below 0.45, therefore the usage can be sufficiently ensured even in the form of these oil.

The invention recited in technical solution 5 is the coating film according to any one of technical solution 1 to technical solution 4, wherein
the $sp^2/sp^3$ ratio of the white hard carbon layers is 0.45-0.85.

In the technical solution of the invention, the $sp^2/sp^3$ ratio of the white hard carbon layers is preferably 0.45-0.85. That is, in the white hard carbon layers, when the $sp^2/sp^3$ ratio is below 0.45, the $sp^2/sp^3$ ratio is too low and chipping resistance cannot be ensured, and when the $sp^2/sp^3$ ratio is above 0.85, the $sp^2/sp^3$ ratio is too high and wear resistance is low. The $sp^2/sp^3$ ratio is particularly preferably 0.5-0.8.

Moreover, regarding the relation of the $sp^2/sp^3$ ratio in each layer, it is more preferable that the $sp^2/sp^3$ ratio of the black hard carbon layers is 0.1-0.45, and the $sp^2/sp^3$ ratio of the white hard carbon layers is 0.45-0.85. By alternately laminating these hard carbon layers, the relatively high-hardness black hard carbon layers having a low $sp^2/sp^3$ ratio and excellent wear resistance and the low-hardness white hard carbon layers having a high $sp^2/sp^3$ ratio and excellent chipping resistance are alternately laminated, and an excellent coating film can be provided which has excellent chipping resistance and wear resistance and an excellent balance of the two performances.

The invention recited in technical solution 6 is the coating film according to any one of technical solution 1 to technical solution 5, wherein
when electron beam diffraction is performed to the white hard carbon layers, diffraction spots are shown at positions with a lattice spacing of 0.3-0.4 nm, and the (002) surfaces are aligned so as to become a direction of lamination on the substrate.

In the technical solution of the invention, when electron beam diffraction is performed to the white hard carbon layers, diffraction spots are shown at positions with a lattice spacing of 0.3-0.4 nm, that is, the C surfaces, (002) surfaces of graphite or grapheme which become the slip surface are aligned so as to be laminated in the thickness direction, so that the sliding surface corresponds to the slip surface of the graphite, and low friction property is improved.

When diffraction spots are shown at positions of 0.3-0.4 nm in the electron beam diffraction of the coating film cross-section perpendicular to the substrate, and clear diffraction spots appear vertically as shown in FIG. 3, the hard carbon is aligned in a way that the C surfaces, (002) surfaces of graphite or graphene are laminated, and thus low friction property is improved and the invention is preferable. An angle formed by the (002) surfaces and the substrate surface is preferably below 30°, particularly preferably below 15°.

The invention recited in technical solution 7 is the coating film according to any one of technical solution 1 to technical solution 6, wherein an electrical resistance on the coating film surface of a member having the coating film is 0.1-1000Ω.

In the technical solution of the invention, by laminating the (002) surfaces in the thickness direction of the coating film, the electrical conductivity in the thickness direction of the columns-shaped hard carbon layers is low, and multiple crystal grain boundaries exist due to the columns-shape of the crystal grains which also have low electrical conductivity in the direction perpendicular to the thickness direction. Therefore, when the measurement is performed by two-terminal method, even when the coating film is coated on an electrical conductor, the electrical resistance on the coating film surface of the member having the coating film is 0.1-1000Ω.

The invention recited in technical solution 8 is the coating film according to any one of technical solution 1 to technical solution 7, wherein
the thickness of each layer of the white hard carbon layers is 20-2000 nm, and
the thickness of each layer of the black hard carbon layers is 20-1000 nm.

In the technical solution of the invention, a coating film with further ensured chipping resistance and wear resistance can be provided. That is, when the thickness of each layer of the white hard carbon layers is too thin and is below 20 nm, it is difficult to ensure chipping resistance, while when the thickness of each layer is too thick and is above 2000 nm, wear resistance decreases. On the other hand, when the thickness of each layer of the black hard carbon layers is too thin and is below 20 nm, it is difficult to ensure wear resistance, while when the thickness of each layer is too thick and is above 1000 nm, chipping resistance decreases.

In this way, in the technical solution of the invention, in order to ensure both the chipping resistance and the wear resistance in each hard carbon layer, the thickness of each layer of the white hard carbon layers is set to 20-2000 nm, and the thickness of each layer of the black hard carbon layers is set to 20-1000 nm. Accordingly, the coating film with sufficiently balanced chipping resistance and wear resistance is provided.

The invention recited in technical solution 9 is the coating film according to any one of technical solution 1 to technical solution 8, wherein
a ratio of the thickness of the white hard carbon layer to the thickness of the black hard carbon layer changes in the thickness direction of the coating film, and increases from the substrate side toward the surface side.

In the technical solution of the invention, a coating film with further balanced chipping resistance and wear resistance can be provided. That is, as mentioned above, the black hard carbon layers have low $sp^2/sp^3$ ratio and excellent wear resistance; on the other hand, the white hard carbon layers have high $sp^2/sp^3$ ratio and excellent chipping resistance. In the technical solution of the invention, a ratio of the thickness of the white hard carbon layers to the thickness of the black hard carbon layers, that is, "the thickness of the white hard carbon layers/the thickness of the black hard carbon layers" increases from the substrate side toward the surface side, so that on the upper surface side of the coating film, the white hard carbon layers become thick and chipping resistance is high, even when large stress is applied to the coating film, chipping resistance is still exhibited. On the other hand, on the lower substrate side of the coating film, the black hard carbon layers become thick and wear resistance is high, even when the upper surface side wears locally and disappears, sufficient wear resistance is still exhibited.

The invention recited in technical solution 10 is the coating film according to any one of technical solution 1 to technical solution 9, wherein
the hydrogen content of the black and/or white hard carbon layers is below 10 atom %.

In the technical solution of the invention, a coating film can be provided which sufficiently exhibits friction-reducing effect in oil and has excellent wear resistance. That is, compared with a hard carbon film not containing hydrogen, the friction-reducing effect in oil of the hard carbon film with a high hydrogen content is poorer, and the hardness also decreases easily. Specifically, when the hydrogen content is above 10 atom %, wear resistance decreases greatly. On the other hand, when the hydrogen content is below 10 atom %, the whole coating film has high hardness and wear resistance can be improved. A content of below 5 atom % is particularly preferable. In the technical solution of the invention, the hydrogen content of at least any one of the black hard carbon layers and the white hard carbon layers is set to below 10 atom %, therefore sufficient wear resistance can be ensured.

Moreover, although it influences little to contain nitrogen (N), boron (B), silicon (Si) and other metal elements, it is preferable that inevitable impurity is eliminated and is not contained in the coating film.

The invention recited in technical solution 11 is the coating film according to any one of technical solution 1 to technical solution 10, wherein
at least one layer of the white hard carbon layers exists in a region within a depth of 1 μm from the surface, and the $sp^2/sp^3$ ratio of the white hard carbon layer is above 0.5.

In the technical solution of the invention, a coating film having more excellent chipping resistance can be provided. That is, the white hard carbon layers exist in the region within a depth of 1 μm from the surface, thereby improving the impact absorbing ability which absorbs impact externally. However, if the $sp^2/sp^3$ ratio of the white hard carbon layers is below 0.5, the impact absorbing ability can only be improved slightly. In the technical solution of the invention, at least one layer of the white hard carbon layer is made to exist in the region within a depth of 1 μm from the surface, and the $sp^2/sp^3$ ratio is set to above 0.5, so that the impact absorbing ability can be improved, and chipping resistance of the coating film can be improved.

The invention recited in technical solution 12 is the coating film according to any one of technical solution 1 to technical solution 11, wherein
an outermost surface is the white hard carbon layer.

In the technical solution of the invention, the soft white hard carbon layer having a great $sp^2/sp^3$ ratio is in the outermost surface, therefore a coating film can be provided which functions as an impact absorbing layer when mechanical impact is applied externally, and which has excellent chipping resistance in particular.

The invention recited in technical solution 13 is the coating film according to any one of technical solution 1 to technical solution 12, wherein
a nano indentation hardness of the black hard carbon layers is 30-80 GPa.

From the perspective of further improving wear resistance of the hard carbon film, the nano indentation hardness of the black hard carbon layers is preferably 30-80 GPa.

The invention recited in technical solution 14 is the coating film according to technical solution 13, wherein
the nano indentation hardness of the white hard carbon layers is 10-30 GPa.

In the technical solution of the invention, the nano indentation hardness of the black hard carbon layers is 30-80 GPa, and the nano indentation hardness of the white hard carbon layers is 10-30 GPa. By making each hard carbon layer have suitable hardness in this way, insufficiency of wear resistance of the hard carbon film is inhibited, while chipping resistance can be effectively improved.

The invention recited in technical solution 15 is a coating film manufacturing method, which forms the coating film according to any one of technical solution 1 to technical solution 14 on a substrate surface using a PVD method; wherein conditions for film formation on the substrate is controlled in a way that the substrate repeatedly alternates temperature increase and temperature decrease between a low temperature range of more than 50° C. to less than 250° C. and a high temperature range of above 250° C. to below 400° C.; and the substrate is made to rotate and/or revolve.

In the technical solution of the invention, conditions for film formation on the substrate are controlled using PVD so that the substrate temperature repeatedly alternates temperature increase and temperature decrease. Accordingly, a coating film can be formed in which the white hard carbon layers and the black hard carbon layers are alternately laminated in the thickness direction.

Specifically, by increasing the temperature to a high temperature range of above 250° C. to below 400° C. and performing film formation under the condition of a bias voltage of below −275 V, white hard carbon is generated, and white columns-shape hard carbon layers can be formed taking the white hard carbon as growth starting points.

In addition, the growth direction of the white hard carbon layers is a direction below 30° relative to the direction perpendicular to the substrate, and preferably, the columns-shaped hard carbon layers which grow toward a direction that is below 15° and substantially perpendicular to the substrate can be formed.

Then, after the white hard carbon layers are formed, the temperature is decreased to a low temperature range of more than 50° C. to less than 250° C. to perform film formation, thereby laminating the black hard carbon layers having a small $sp^2/sp^3$ ratio as done in the existing PVD method. Then, a coating film in which the white hard carbon layers and the black hard carbon layers are alternately laminated in the thickness direction can be formed by repeatedly alternating temperature increase and temperature decrease to form the film.

The invention recited in technical solution 16 is the coating film manufacturing method according to technical solution 15, wherein on the substrate, the hard carbon layers including the white columns-shape are formed by forming the film under a condition of a bias voltage of −275 to −400 V during the film forming at a high temperature range of above 250° C. to below 400° C.

In the optimization of the parameters mentioned above, the especially important parameters are bias voltage, arc current, and substrate temperature controlled by heater.

That is, when the bias voltage is above −275 V, it is difficult to form columns-shaped hard carbon layers, and when the bias voltage is below −400 V, wear resistance decreases easily. Besides, it is difficult to align in a way that the (002) surfaces, which are the C surfaces of graphite or grapheme that become the slip surface, are laminated in the thickness direction, and low friction property of the columns-shaped hard carbon layers easily decreases.

The invention recited in technical solution 17 is the coating film manufacturing method according to technical solution 15 or technical solution 16, wherein arc PVD is used as the PVD method, and at least one parameter of bias voltage, arc current, heater temperature and furnace pressure is controlled in order to repeatedly alternates temperature increase and temperature decrease of the substrate.

Arc PVD is a film-forming method capable of generating active carbon particles with high ionization rate and coating the carbon particles; by optimizing bias voltage, arc current, heater temperature, furnace pressure and so on, white hard carbon can be grown out of active carbon particles, and columns-shaped hard carbon layers can be formed taking the white hard carbon as growth starting points.

By using arc PVD, applying a bias voltage below −275 V and setting the substrate temperature to 250° C. to 400° C., white hard carbon layers can be made to grow in the thickness direction in a columns-shape.

In addition, when arc PVD is used, parameters such as bias voltage, arc current, heater temperature, furnace pressure are optimized when the temperature increase and temperature decrease of the substrate are repeatedly alternated. Accordingly, the temperature increase and temperature decrease of the substrate can be accurately controlled.

The invention recited in technical solution 18 is the coating film manufacturing method according to technical solution 17, wherein the bias voltage is controlled to −50 to −1500 V, and the arc current is controlled to 10-200 A.

In the coating film manufacturing method, the particularly important parameters are the bias voltage and the arc current. That is, if the bias voltage is above −50 V, it is difficult to form the white hard carbon layers, and if the bias voltage is below −1500 V, it is difficult to form the black hard carbon layers. Moreover, if the arc current is below 10 A, it is difficult to discharge, and when the arc current is above 200 A, wear resistance decreases easily.

The invention recited in technical solution 19 is the coating film manufacturing method according to technical solution 17, wherein the substrate temperature is decreased by setting the bias voltage to 0 V and/or setting the arc current to 0 A.

In the coating film manufacturing method, by setting the bias voltage to 0 V and/or setting the arc current to 0 A, that is, making the arc current stop flowing, the substrate temperature can be easily decreased.

The invention recited in technical solution 20 is the coating film manufacturing method according to technical solution 19, wherein in a temperature increase initial step after the temperature decrease, the bias voltage is set to −400 V to −1500 V and the arc current is set to 10-200 A to carry out a bombard treatment using graphite target, and a purification treatment of the substrate surface exposed to furnace atmosphere during the temperature decrease and/or film-formation of adhesion layers including white hard carbon are carried out.

In the coating film manufacturing method, in the temperature increase initial step after the temperature decrease, the bias voltage is set to −400 V to −1500 V and the arc current is set to 10-200 A. Then, if film formation is carried out with a graphite target under this condition, because the bias voltage is set to a value greater than the value on a minus side, great impact energy is applied to carbon particles, a mixing mode of etching and film formation on the substrate surface is easily achieved, and the purification treatment of the substrate surface and the formation of the adhesion layer including white hard carbon are simultaneously carried out.

During the temperature decrease in a film-formation step, the substrate surface during the film formation experiences pollution inside the furnace caused by atmosphere gas, furnace temperature and other environments (oxidization or gas adsorption and so on) or stabilization (conversion of $sp^3$ to $sp^2$ and so on), and activity of the substrate surface tends to decrease. For this reason, boundary adhesion force between a coating film before restarting of film formation and a coating film formed after the restarting of film formation tends to decrease easily, and the adhesion force of a part corresponding to the boundary between a white hard layer and a black hard layer tends to decrease easily.

However, in the technical solution of the invention, the boundary of the black hard layer and the white hard layer is formed continuously, and the white hard layer grows from the black hard layer in a columns-shape in the thickness direction, therefore excellent adhesion force is obtained, and the adhesion force between the white hard layer and the black hard layer above the white hard layer forms the adhesion layer, therefore the adhesion force in any boundary is excellent.

The invention recited in technical solution 21 is an arc PVD apparatus, which is used in any one of the coating film manufacturing method according to technical solution 17 to technical solution 20, and includes
a control mechanism which controls the substrate temperature to more than 50° C. and below 400° C.

In the technical solution of the invention, the PVD apparatus includes a control mechanism which controls the substrate temperature to more than 50° C. and below 400° C., therefore the repeated alternation of temperature increase and temperature decrease of the substrate between the low temperature range of more than 50° C. to less than 250° C. and the high temperature range of above 250° C. to below 400° C. can be easily controlled. The specific control mechanism may be a method of arranging a heater for heating the substrate evenly, a method of introducing a heating mechanism or a cooling mechanism to a fixture that sets the substrate, or a method of automatically controlling the bias voltage or the arc current based on the substrate temperature monitored by a thermocouple.

Besides, in the technical solution of the invention, the black hard carbon layers are easily formed at a temperature of more than 50° C. and less than 250° C., and the white hard carbon layers are easily formed at a temperature of above 250° C. and below 400° C., and more preferably at a temperature of 275° C. to 375° C. Besides, theses temperatures are influenced by the arc current and the bias voltage, and are temperatures changing with each condition. The white columns-shaped hard carbon layers are easily formed when film formation is performed in the range of a bias voltage of −275 V-to −400 V.

The invention recited in technical solution 22 is the arc PVD apparatus according to technical solution 21, including:
a substrate supporting mechanism that supports the substrate to rotate and revolve freely; and
a rotary control mechanism, which controls the rotation speed and/or revolution speed of the substrate.

In the technical solution of the invention, by supporting the substrate to rotate and revolve freely for controlling the rotation and revolution, black hard carbon can be formed in the gaps of white hard carbon when the white hard carbon layers having a high $sp^2/sp^3$ ratio are grown in a columns-shape.

The invention recited in technical solution 23 is the arc PVD apparatus according to technical solution 21 or technical solution 22, wherein
a cylindrical structure for cooling the substrate is included in a central part of the arc PVD apparatus.

By arranging a cylindrical structure in a central part of the arc PVD apparatus to cool the substrate, even if readily available water is used as a cooling medium, the cooling ability does not become too high. For this reason, the substrate can be easily heated to a target temperature, and the white hard carbon layers are easily formed, while sufficient cooling ability during the cooling can be ensured. Besides, by disposing such a cylindrical structure for cooling, even when a great arc current is used, the film-formation temperature can be prevented from increasing above the target temperature, can film-formation speed can be raised. Besides, because the cooling time can also be shortened, the coating film can be formed with a high productivity even when the film is thickly formed.

Effect of the Invention

According to the present invention, a technology can be provided, which, in addition to being capable of forming thick hard carbon films of excellent durability even using PVD, is able to balance chipping resistance and wear resistance in the formed hard carbon film and able to improve low friction properties and peeling resistance.

BRIEF DESCRIPTION OF THE DRAWINGS

FIG. 5A is a situation is which a structure for cooling (cooling tower) is not disposed in the center, and FIG. 5B is a situation in which the structure is disposed.

DESCRIPTION OF THE EMBODIMENTS

The present invention is described below according to implementation forms and with reference to the drawings.
1. Substrate In the present invention, the substrate to form a hard carbon film which becomes a coating film is not particularly limited, and in addition to iron-based substrates, non-iron-based metal or ceramic, hard composite and other substrates can be used. Specifically, carbon steel, alloy steel, bearing steel, quenched steel, tool steel, cast iron, aluminum alloy, Mg alloy or super-hard alloy etc. can be listed, and if the film-forming temperature of the hard carbon film is considered, a substrate whose characteristics are not significantly degraded at a temperature above 250° C. is preferred.

2. Intermediate Layer

When the hard carbon film is formed, an intermediate layer is preferably pre-set on the substrate. Thus, adhesion between the substrate and the hard carbon film can be increased, and in the case that the hard carbon film is worn, the exposed intermediate layer can be given play to the function of wear resistance.

At least one of Cr, Ti, Si, W, B and other elements can be employed for such an intermediate layer. In addition, nitride, carbon nitride, carbide and the like of at least one of Cr, Ti, Si, Al, etc. can be used in a lower layer of the elements, and such compounds include, for example, CrN, TiN, CrAlN, TiC, TiCN, TiAlSiN and the like.

3. Coating Film

The coating film of the present invention has two types of hard carbon layers which are shown as relatively black and white when observed in a cross-sectional bright-field TEM image, and the white hard carbon layers and the black hard carbon layers are alternately laminated to form a hard carbon film.

Figure 1:
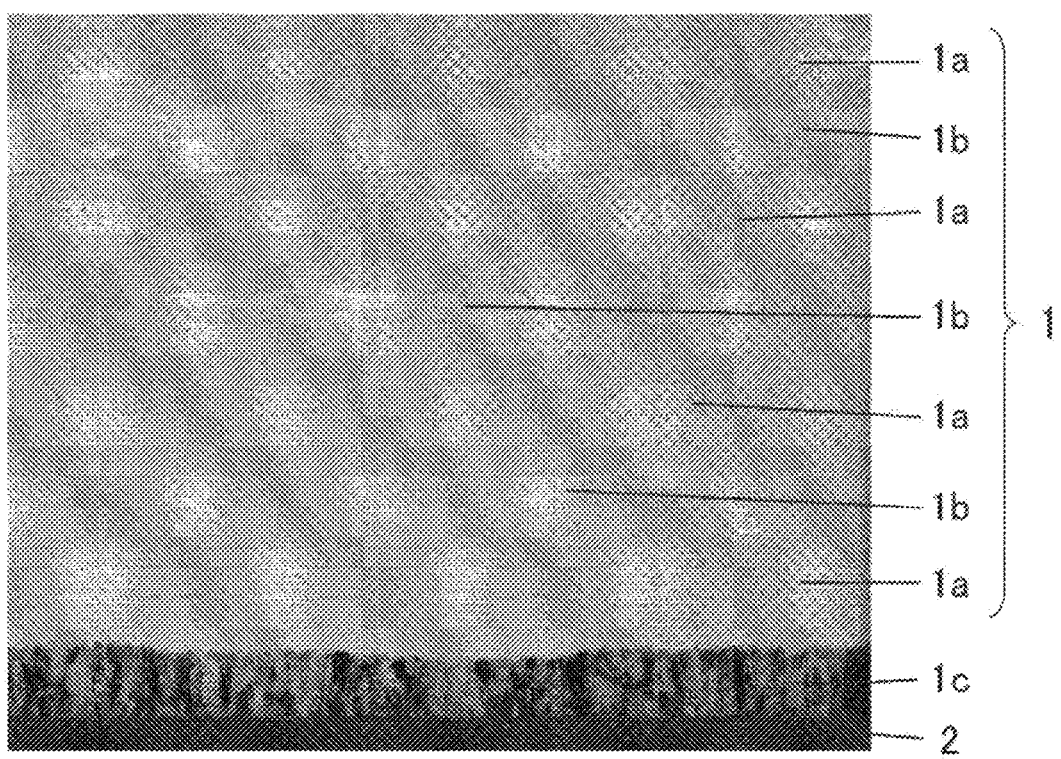
FIG. 1 is a cross-sectional bright-filed TEM image of a coating film (hard carbon film) according to an implementation form of the present invention.
Figure 2:
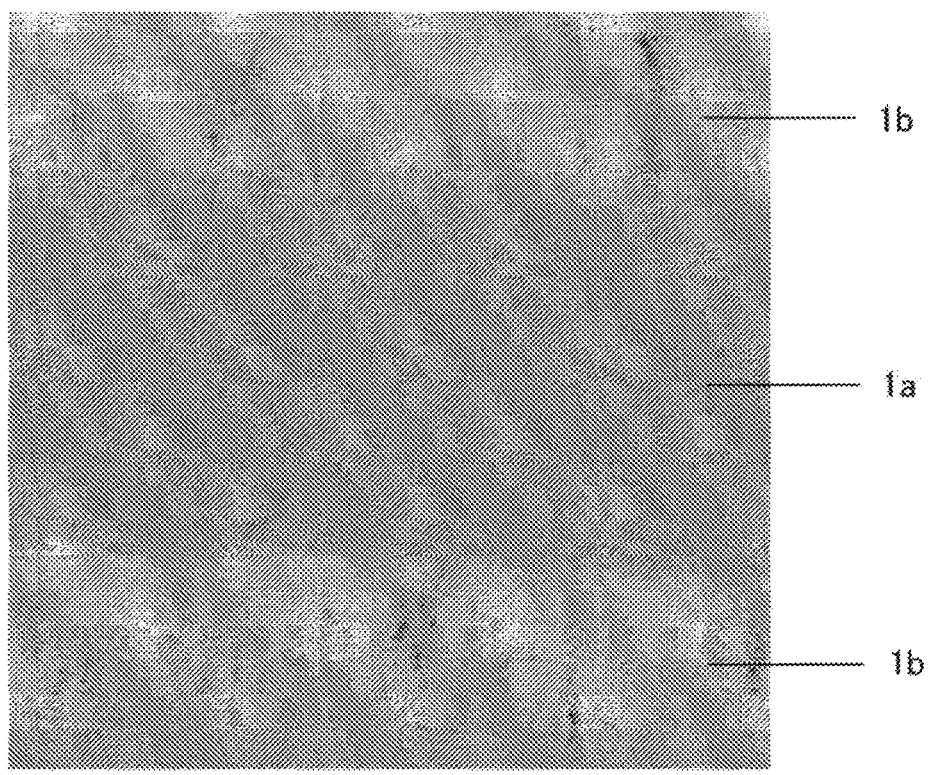
FIG. 2 is an enlarged view of one part of FIG. 1.

FIG. 1 is a cross-sectional bright-field TEM image of a coating film (hard carbon film) according to an implementation form of the present invention. FIG. 2 is an enlarged view of one part of FIG. 1. In addition, FIG. 1 and FIG. 2 are bright-field TEM images obtained under the condition of an acceleration voltage of 300 kV.

In FIG. 1, the symbol 1 is a coating film, and the symbol 2 is a substrate. As shown in FIG. 1, in this implementation form, on the coating film 1, black hard carbon layers 1$a$ and white hard carbon layers 1$b$ are alternately laminated toward the surface of the coating film 1. In addition, in FIG. 1, an intermediate layer 1$c$ of Cr is arranged right above the substrate 2.

Besides, according to FIG. 2, the white hard carbon layers 1$b$ grow into a columns-shape in the thickness direction, and the growth direction is substantially perpendicular to the substrate. If the direction perpendicular to the substrate is set to 0°, the growth direction inclines at an angle within ±5°. Besides, it is observed that the white hard carbon layers 1$b$ have a growth shape with a characteristic which can be described as column-like, fiber-like, comb-like, bar-like and so on, and in the thickness direction of the hard carbon film, the change from the black carbon layers to white carbon layers is abrupt and clear.

Moreover, bright-field TEM images as shown in FIG. 1, FIG. 2 are obtained, the thickness of the black hard carbon layer 1$a$ having a small $sp^2/sp^3$ ratio and the thickness of the white hard carbon layer 1$b$ having a great $sp^2/sp^3$ ratio are measured, and calculation is performed on how the two ratios change in the thickness direction of the coating film, by which the ratio change in the thickness of the two layers, that is, the black hard carbon layer 1$a$ having a small $sp^2/sp^3$ ratio and the white hard carbon layer 1$b$ having a great $sp^2/sp^3$ ratio, in the thickness direction of the coating film can be measured.

In the present invention, regarding the white hard carbon layers 1$b$ having a high $sp^2/sp^3$ ratio, the $sp^2/sp^3$ ratio is preferably 0.45-0.85, and more preferably 0.5-0.8. Besides, preferably, the white hard carbon layers 1$b$ have diffraction spots (scattering pattern of graphite) at positions with a lattice spacing of 0.3-0.4 nm in an electron beam diffraction, and (002) surfaces are aligned in a direction parallel to the substrate. In this way, most of the white hard carbon has a scattering pattern of graphite and shows a specific orientation; accordingly, for the white hard carbon layers 1$b$, low friction property is greatly improved because the slip surface of graphite with excellent low friction property becomes a horizontal direction relative to the substrate, and chipping resistance is greatly improved because the columns-shaped crystals exhibit high strength when stress repeatedly acts on the hard carbon film which is a coating film.

On the other hand, the $sp^2/sp^3$ ratio of the black hard carbon layers 1$a$ is preferably 0.1-0.45, and more preferably 0.15-0.4. Besides, the hydrogen content of the black hard carbon layers 1$a$ is preferably below 10 atom %, more preferably below 5 atom %, and further preferably 0 atom %, and it is preferable if the remaining part substantially contains carbon only since hardness is increased and wear resistance is improved. In addition, the expression of "substantially contains carbon only" here means not containing impurity except N, B, Si and other inevitable impurity.

Figure 3:
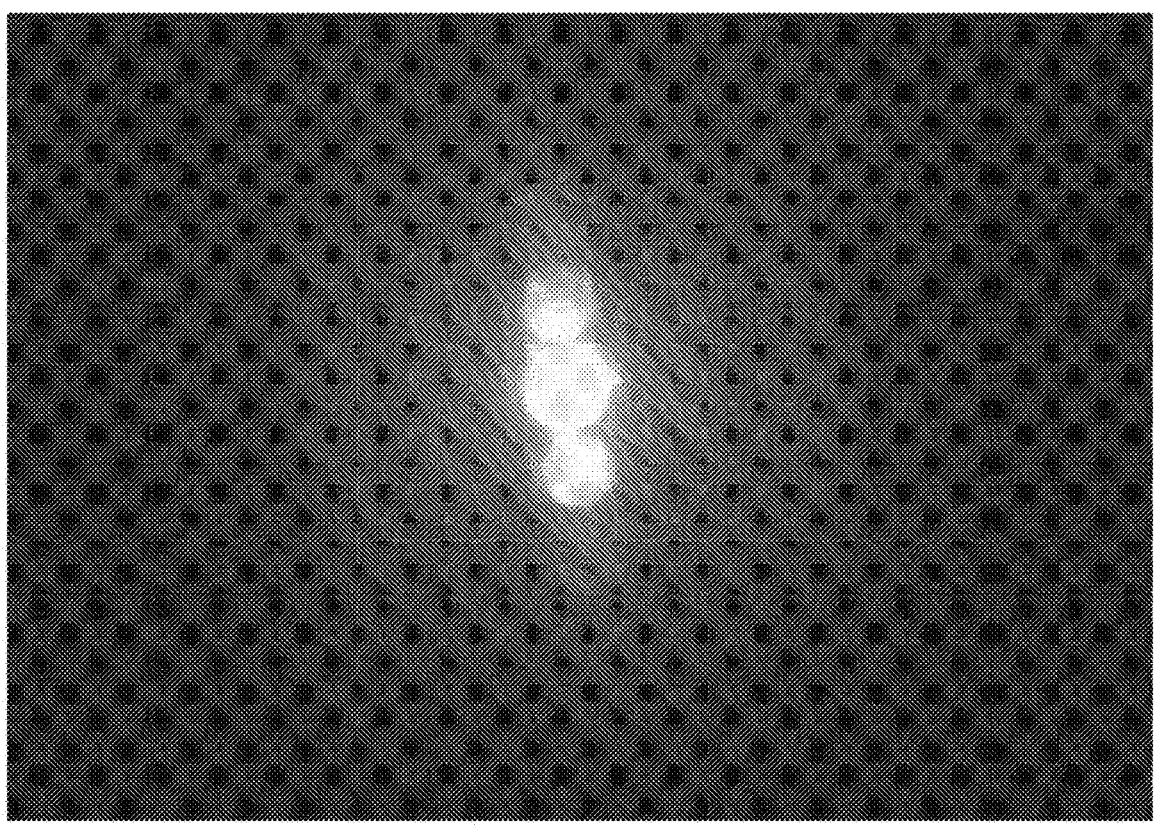
FIG. 3 is an electron beam diffraction result of columns-shaped hard carbon layers.

When electron beam diffraction is performed to the white hard carbon layers, diffraction spots are shown at positions with a lattice spacing of 0.3-0.4 nm, and the (002) surfaces are aligned so as to be laminated on the substrate, which indicates the moment when diffraction spots as shown in FIG. 3 are obtained. In FIG. 3, the diffraction spots originated from the (002) surface of graphite appear in a vertical direction, and thus it can be determined that the (002) surfaces are aligned so as to be laminated on the substrate.

It is also preferable that the hydrogen content of the white hard carbon layers 1$b$ is below 10 atom %, and more preferably below 5 atom %, and the remaining part substantially contains carbon only, not containing impurity except N, B, Si and other inevitable impurity; however, even if these elements are contained in the white hard carbon layers 1$b$, chipping resistance can also be improved.

Moreover, the nano indentation hardness of the black hard carbon layer 1$a$ is preferably 30-80 GPa, by which wear resistance of the hard carbon film can be further improved. On the other hand, the nano indentation hardness of the white hard carbon layer 1$b$ is preferably 10-30 GPa. By making each hard carbon layer have suitable hardness in this way, insufficiency of wear resistance of the hard carbon film can be inhibited, and chipping resistance can be effectively improved.

4. Manufacturing Method of Coating Film (Hard Carbon Film) and Arc PVD Apparatus (1) Manufacturing Method When the coating film 1 is formed, an arc PVD method, a sputtering PVD method and the like may be used, and particularly the arc PVD method is preferred.

In the arc PVD method, a minus bias voltage is applied to the substrate. For this reason, when carbon ions flying out of a target collide with the substrate, the carbon ions are subject to the influence of the high-temperature substrate and a high bias voltage, and crystal growth easily occurs in a fixed direction, and thus the hard carbon layers easily grow in the form of columns-shaped hard carbon layers.

In this implementation form, in the case that the hard carbon film is formed using the arc PVD method, a bias voltage or arc current is regulated, or the substrate is heated by a heater, or the substrate is cooled in a forced way by importing a cooling mechanism on a fixture (holder) provided with the substrate to control the substrate temperature and control the furnace pressure and the like, thereby forming a hard carbon film in which hard carbon layers with different $sp^2/sp^3$ ratios are alternately laminated.

Besides, when forming the black hard carbon layers with a $sp^2/sp^3$ ratio of 0.1-0.45, it is formed in an existing way at a substrate temperature ranging from more than 50° C. to less than 250° C. Therefore, in order to alternately laminate the black hard carbon layers and the white hard carbon layers, the following method can be used which imports a cooling step after the formation of white hard carbon layers to decrease the substrate temperature, and forms the black hard carbon layers when the substrate temperature is less than 250° C.

On the other hand, when forming the columns-shaped white hard carbon layers with a $sp^2/sp^3$ ratio of 0.45-0.85, it is controlled so that the substrate temperature ranges from above 250° C. to below 400° C., more preferably 275° C. to 380° C. In addition, such control of substrate temperature is preferably carried out by controlling the bias voltage to −275 to −400 V; however, the substrate temperature can also be controlled by methods such as change of the arc current, heating by a heater or cooling by a holder, applying a bias voltage intermittently such as discontinuously or pulse-like to change the voltage value, therefore the method is not particularly limited to bias voltage control only.

In contrast with such an implementation form, in the existing hard carbon film manufacturing method, particularly in the case that arc PVD is used for film formation, in order to form a high-density hard carbon film, usually only the bias voltage or the arc current is controlled to form the film under the condition that the substrate temperature is more than 250° C. and does not increase, but the furnace temperature is not uniform due to thermal capacity of a workpiece, a mounting fixture or charge amount, and the substrate temperature cannot be sufficiently controlled.

In this way, in the existing hard carbon film manufacturing method, a concept of strictly controlling the substrate temperature is lacking, and there is no understanding about the following effect from the existing hard carbon film manufacturing method: as in the present invention, the structure of the hard carbon layer can be controlled by controlling the substrate temperature, chipping resistance and wear resistance can be balanced by alternately laminating hard carbon layers with different $sp^2/sp^3$ ratios, and low friction properties and peeling resistance can also be improved simultaneously by controlling the structure growth shape of the hard carbon layer having a great $sp^2/sp^3$ ratio.

In addition, during film-forming, the substrate is made to rotate and revolve, and preferably, the substrate rotates at 10-200 rpm, and revolves at 1-20 rpm.

Under such a manufacturing condition, the white hard carbon layer having a great $sp^2/sp^3$ ratio can be formed, although the reason why the hard carbon layers grow into a columns-shape is uncertain, it may be considered as follows.

That is, it is considered that if the film is formed in a range that the substrate temperature is above 250° C. and below 400° C. and the bias voltage is −275-400 V, when the carbon ions flying out of the target collide with the substrate, the ions are subject to the influence of the high-temperature substrate and a high minus bias voltage, and crystal growth easily occurs in a fixed direction, and thus the hard carbon layers easily grow in the form of columns-shaped hard carbon layers.

In addition, hereinabove, the substrate temperature is preferably ranging from above 250° C. to below 400° C. when forming the white hard carbon layers having a high $sp^2/sp^3$ ratio, and the reason is as follows: when the substrate temperature is below 250° C., it is difficult for the columns-shaped white hard carbon layers to grow even if the carbon ions are incident into the substrate from the front; on the other hand, when the substrate temperature is above 400° C., although the white hard carbon layers are columns-shaped, hardness easily decreases and wear resistance easily decreases.

Also, as mentioned above, in addition to adjusting the bias voltage, the substrate temperature can be adjusted by adjusting the arc current, the heater temperature, the furnace pressure and the like, but when the bias voltage is above −275 V, it is difficult to form columns-shaped hard carbon layers, and when the bias voltage is below −400 V, wear resistance easily decreases. With consideration of this situation, the bias voltage is preferably −275 to −400 V, and more preferably −275 to −380 V. Besides, regarding the furnace pressure, in the case of a vacuum environment set as $10^{-4}$ to $5 \times 10^{-1}$ Pa, compared with the situation where hydrogen or nitrogen is imported, a low-friction and high-wear-resistance hard carbon film can be obtained, which is thus preferred.

Figure 4:
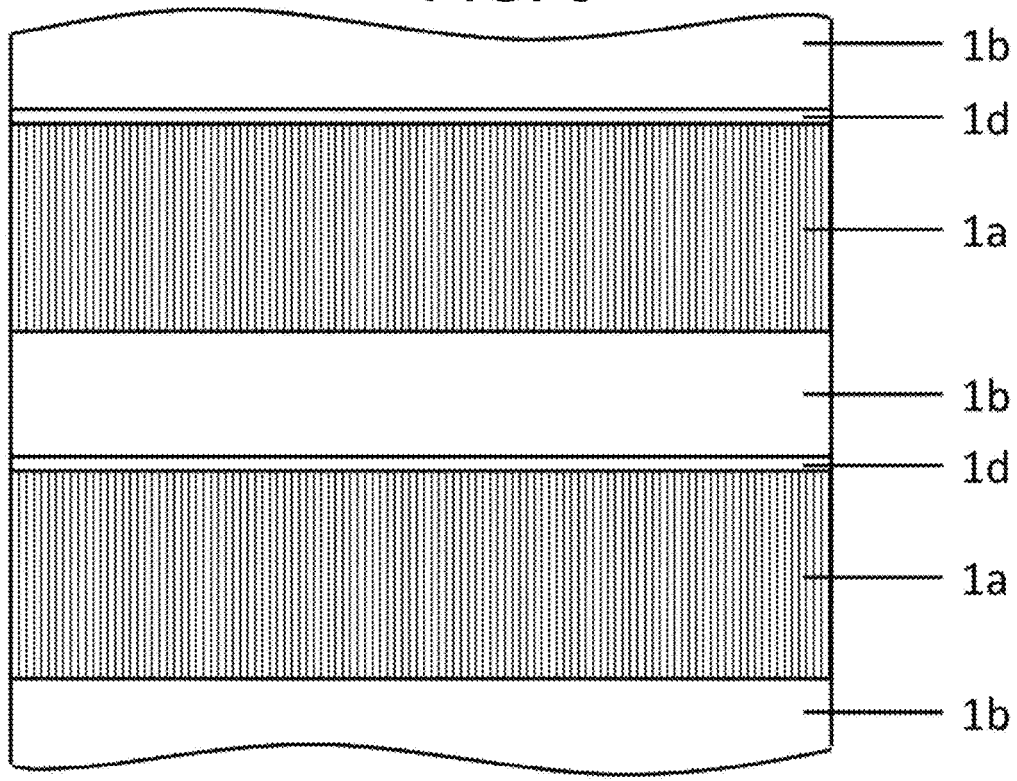
FIG. 4 is a diagram schematically indicating a cross-section of a coating film (hard carbon film) according to another implementation form of the present invention.

It is preferable that in the temperature increase initial step after the temperature decrease, the bias voltage is set to −400 V to −1500 V and the arc current is set to 10-200 A to carry out a bombard treatment using graphite target, and a purification treatment of the substrate surface exposed to furnace atmosphere during the temperature decrease and/or film-formation of the adhesion layer $1d$ including white hard carbon are carried out (see FIG. 4). The reason is that: if the bias voltage is greater than −400 V, it is difficult to carry out the purification treatment of the substrate surface, if the arc current is below 10 A, the purification treatment is hard to be effective, and if the arc current is above 200 A, the film-forming mode is stronger than the purification treatment, influence of droplet increases and surface roughness decreases, and thus it is preferably below 200 A.

The hard carbon film in this implementation form can be manufactured using an arc PVD apparatus, and a specific film-forming device, for example, may be an arc PVD apparatus M720 manufactured by the Japanese ITF Company. In the following, manufacturing of a hard carbon film (coating film) using the arc PVD apparatus is specifically described.

First, a metal raw material (surface roughness Ra: 0.2 μm) becoming a substrate is prepared, and the substrate is set in an arc PVD apparatus provided with a rotating and revolving fixture.

Next, the arc current and the bias voltage are adjusted, in a way that the substrate temperature is more than 50° C. but less than 250° C. while the substrate is made to rotate and revolve, to form a black hard carbon layer having a small $sp^2/sp^3$ ratio. Then, control in a way that the substrate temperature is above 250° C. but below 400° C., and in a way of heating the substrate by a heater or adjusting the bias voltage or the arc current to make the substrate temperature increase continuously, and make the white hard carbon layer having a great $sp^2/sp^3$ ratio grow in a columns-shape. Then, a film-forming time of becoming non-bias and/or non-arc-current is imported to cool the substrate, and when the substrate temperature decreases to a predetermined temperature, form a black hard carbon layer again; by repeating the film-formation step of the black hard carbon layer in this way, the hard carbon film in which the black hard carbon layers and the white hard carbon layers are alternately laminated can be formed.

As mentioned above, it is considered that, by changing the substrate temperature continuously in this way from a low-temperature environment to a high-temperature environment, the highly active hard carbon particles which can fly into the substrate with certain probability and have a great $sp^2/sp^3$ ratio become the starting points, the growth of the hard carbon layer is influenced by the lower layer, and the white hard carbon layer having a great $sp^2/sp^3$ ratio grows out of the black hard carbon layer having a small $sp^2/sp^3$ ratio in a columns-shape in the thickness direction as in a CVD growth.

(2) Arc PVD Apparatus

Figure 5A:
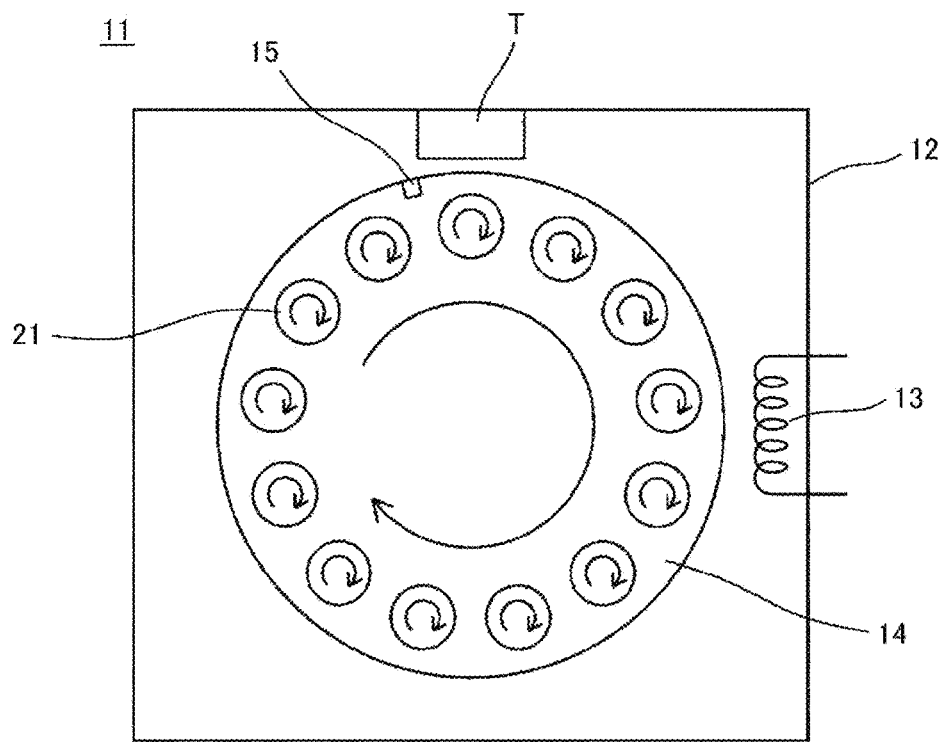
FIG. 5A and FIG. 5B are diagrams that schematically indicates main parts of a furnace for use in hard carbon film formation of an arc PVD apparatus according to an implementation form of the present invention.
Figure 5B:
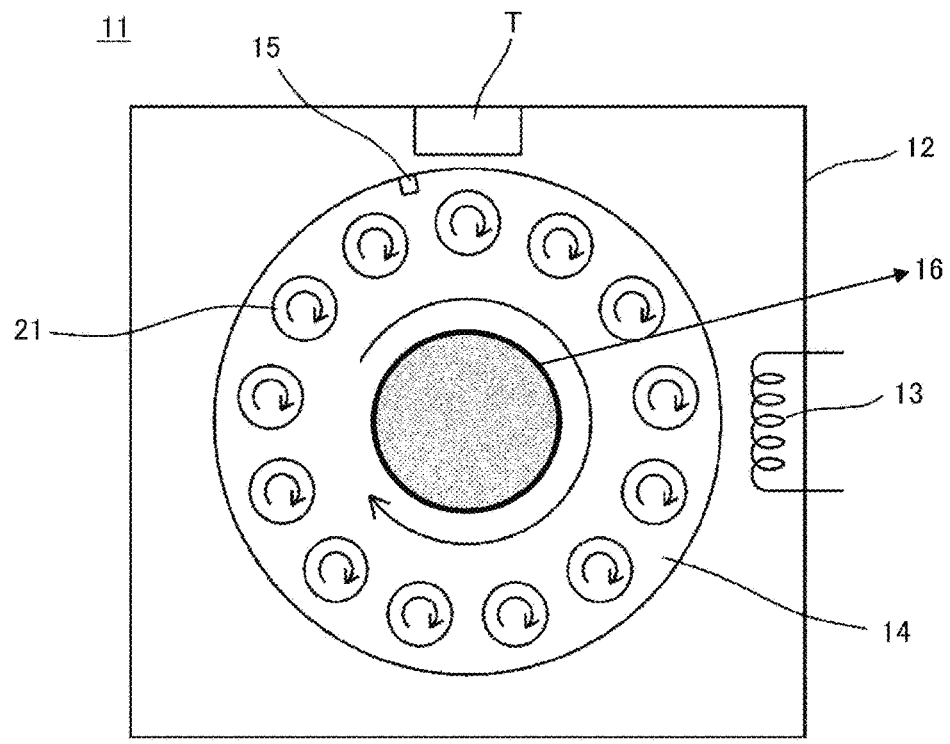

Then, the arc PVD apparatus of the implementation form is specifically described. FIG. 5A and FIG. 5B are diagrams that schematically indicates main parts of a furnace for use in formation of hard carbon film of the arc PVD apparatus according to the implementation form, FIG. 5A is a situation in which a structure for cooling (cooling tower) is not disposed in the center, and FIG. 5B is a situation in which the structure is disposed.

As shown in FIG. 5A, the arc PVD apparatus includes a furnace 11 for use in film-forming and a control device (not shown). In the furnace 11, a vacuum chamber 12, a plasma generation device (not shown), a heater 13, a rotating and revolving fixture 14 serving as a substrate supporting device, a thermocouple (T.C.10 mm square bar) 15 serving as a temperature measuring device, a bias power source (not shown) and a pressure adjusting device (not shown) that adjusts the pressure in the furnace are arranged.

Besides, a cooling and heating device that supplies cooling water and/or warm water or steam is provided on the substrate supporting device. In addition, the symbol T is a target (carbon target), and the symbol 21 is a substrate (iron substrate) with an intermediate layer formed thereon. Besides, actually there are five targets T, but for the sake of simplification, only one target is depicted in FIG. 5A.

The plasma generation device includes an arc power source, a cathode and an anode, by discharge through a vacuum arc between the cathode and the anode, carbon is evaporated from the carbon target T as a cathode material, and plasma containing an ionized cathode material (carbon ion) is generated. The bias power source applies a predetermined bias voltage to the substrate 21 to make the carbon ions fly towards the substrate 21 with suitable kinetic energy.

The rotating and revolving fixture 14 is disk-like, and freely rotates in the arrow direction with the center of the disk as a rotation center; on the upper surface, multiple rotary shafts concentrically perpendicular to the center of the disk are provided at an equal interval. Multiple substrates 21 are retained by the rotary shafts respectively, and freely rotate in the arrow direction. Thus, the substrate 21 is retained on the rotating and revolving fixture 14 to rotate and revolve freely. Besides, for the rotating and revolving fixture 14, a metal material with high thermal conductivity such as stainless steel is used in a manner of quickly transferring heat between the substrates 21 and the rotating and revolving fixture 14 and making temperatures of the substrates 21 and the rotating and revolving fixture 14 substantially equal.

The heater 13 and the cooling device heat and cool the rotating and revolving fixture 14 respectively, thus indirectly heating and cooling the substrates 21. Here, the heater 13 is formed in a manner of regulating the temperature. On the other hand, the cooling device is formed in a manner of adjusting a supply speed of cooling water. Specifically, the cooling device is formed in a manner of supplying the cooling water for the rotating and revolving fixture 14 and/or the rotary shaft during implementation of cooling and stopping supplying the cooling water when the cooling stops, and is formed in a manner of supplying warm water or steam for the rotating and revolving fixture 14 and/or the rotary shaft during heating and stopping supplying the warm water or steam when the heating stops.

Besides, the thermocouple 15 is installed near the substrate 21, and is formed in a manner of indirectly measuring the substrate temperature to make at least one of the arc current value, the bias voltage value, and the heater temperature change in film-forming, thus controlling the substrate temperature to be a target substrate temperature.

Regarding the rotary speed of the rotating and revolving fixture 14, the control device controls various rotary speeds to be a predetermined rotary speed under a preselected combination of rotation and revolution in a manner of forming a columns-shaped hard carbon layer having a great $sp^2/sp^3$ ratio and forming a film without bias; in addition, according to the measurement results of the thermocouple 15 for the temperature of the substrate 21, the bias voltage, the arc current, the heater temperature, and the furnace pressure are optimized. Thus, the temperature of the substrate 21 during film-forming can be maintained within a temperature range of more than 50° C. but below 400° C. Besides, the work of the cooling device and the applied pattern of the bias voltage are controlled as required.

For example, a feedback system is preferably added when the substrate is disposed in 3 segments, and the feedback system measures substrate temperature in upper, middle and lower segments, properly changes arc current values or bias voltage in various positions of the upper, middle and lower segments during film-forming according to measured values, and sets the substrate temperatures in various positions of the upper, middle and lower segments as a target temperature. Thus, stabilization of a film structure of hard carbon films formed on the substrate disposed on the upper, middle and lower segments can be achieved.

In addition, in the film-forming of the existing hard carbon film, for film-forming parameters such as bias voltage, arc current and the like, in most cases, predetermined values are input into the control device before film-forming, film-forming is conducted under a pre-programmed film-forming condition, and the arc current or the heater temperature is not changed according to the substrate temperature measured in the middle of film-forming based. Therefore, in the existing hard carbon film formation, temperatures in the furnace or temperatures between batches are more non-uniform.

Preferably, in the central part of the arc PVD apparatus, a cylindrical structure (cooling tower 16) as shown in FIG. 5B for cooling the substrate is arranged. By circulating and using cooling water in such a cylindrical structure, even if readily available water is used as a cooling medium, the cooling ability does not become too high, and the substrate can be easily heated to a target temperature, thus the white hard carbon layers are easily formed, and sufficient cooling ability during the cooling can be ensured, thus it is preferable.

Figure 6:
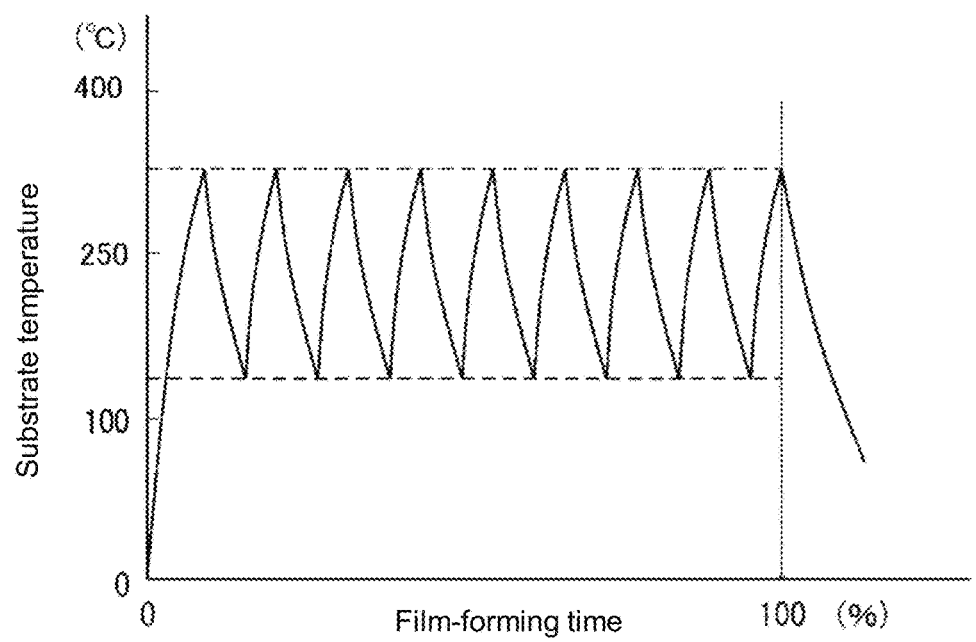
FIG. 6 is a diagram that conceptually indicates changes of the substrate temperature when forming a hard carbon film according to an implementation form of the present invention.

During the formation of the coating film 1 (see FIG. 1), the temperature control device makes the substrate 21 repeatedly alternates temperature increase and temperature decrease between a temperature set within a low temperature range of more than 50° C. but less than 250° C. and a temperature set within a high temperature range of above 250° C. and below 400° C. An example is shown in FIG. 6. In FIG. 6, the vertical axis is the substrate temperature (° C.), and the horizontal axis is the film-forming time of the hard carbon film, specifically, a ratio (%) of the film-forming time when the time required for formation of the total film thickness is set as 100%. The temperature in the low temperature range, the temperature in the high temperature range, speed and cycle numbers of temperature increase and temperature decrease are suitably set according to the thickness of each layer of the black hard carbon layers and the white hard carbon layers, total film thickness of the hard carbon film and the like.

5. Inspection Method of Hard Carbon Film (Coating Film)

The hard carbon film (coating film) formed in the above is inspected according to the following items.

(1) Observation of TEM Structure

Through a TEM (Transmission Electron Microscope), a coating film thin-filmed using a Focused Ion Beam (FIB) is observed, for example, in a bright-field TEM image at an acceleration voltage of 300 kV.

(2) Measurement of Hydrogen Content

The hydrogen content in the coating film is measured through Hydrogen Forward Scattering (HFS) analysis.

(3) Judgment Method of Crude Density of the Hard Carbon Layer

The density of the hard carbon film may generally be measured using a Grazing Incidence X-ray Analysis (GIXA) method or a Grazing Incidence X-ray Reflectivity (GIXR) method. However, in a situation where small-density crude hard carbon and large-density dense hard carbon in the hard carbon layer are dispersed finely, it is difficult to utilize the method to measure density of various portions with high precision.

For the crude density judgment of such a hard carbon layer, for example, a method of effectively utilizing brightness of a bright-field TEM image disclosed in Japanese Patent Gazette No. 4918656 can be used. Specifically, in the bright-field TEM image, the lower the density is, the more the penetration amount of the electron beam increases. Therefore, in the case of forming the same substance, the lower the density is, the whiter the image is. So, in order to judge the density of each layer in multiple hard carbon layers of the same composition, preferably, a cross-sectional bright-field TEM image of the structure of the hard carbon layer is used.

In the cases of the bright-field TEM images in FIG. 1 and FIG. 2, it can be seen that the color of the hard carbon layers of the section 1$b$ is whiter than the color of the hard carbon of the section 1$a$. Moreover, in the section 1$b$, the white hard carbon is a complicated state able to be described as columnlike, fiber-like, comb-like, bar-like and the like extending in the thickness direction. In order to make a color difference between white and black evident, color correction can be made in a manner of highlighting the contrast.

(4) Amorphous Judgment Method of the Coating Film

The coating film formed by thin-filming the cross-section using FIB carries out electron beam diffraction under a condition of an acceleration voltage of 200 kV, a sample absorption current $10^{-9}$ A, and a beam spot size of 0.7 nm$\phi$, to obtain an image of a tiny beam diffraction pattern, if the image is a diffuse scattering pattern, it is judged as amorphous, and if a spot-like pattern is observed, intensity spacing L near the spot is measured, and lattice spacing $\lambda$ (nm) is calculated according to a relation that 2L$\lambda$=camera length.

(5) Measuring Method of ID/IG Ratio Obtained by Raman Spectroscopy

The hard carbon layer may be obtained by separating peaks of Raman spectrum obtained through Raman spectroscopy. Specifically, the peak position of the D band is fixed to 1350 cm$^{-1}$ for selection, the area intensity of this peak is set as ID, the peak position of the G band is near 1560 cm$^{-1}$ for free setting and peak separation, the area intensity of this peak is set as IG, and the ID/IG ratio is calculated.

(6) Measuring Method of the Sp$^2$/Sp$^3$ Ratio

Through Electron Energy-Loss Spectroscopy (EELS) analysis, 1s→$\pi$* intensity and 1s→$\sigma$* intensity is measured, the 1s→$\pi$* intensity is viewed as the sp$^2$ intensity, the 1s→$\sigma$* intensity is viewed as the sp$^3$ intensity, and the ratio, that is, a ratio of 1s→$\pi$* intensity to 1s→$\sigma$* intensity is calculated as the sp$^2$/sp$^3$ ratio. Accordingly, the sp$^2$/sp$^3$ ratio in the present invention is actually the ratio of $\pi$/$\sigma$ intensity. Specifically, with a spectral imaging method in a STEM (scanning TEM) mode, under a condition of an acceleration voltage of 200 kV, a sample absorption current of $10^{-9}$ A, and a beam spot size of $\phi$1 nm, EELS obtained at an interval of 1 nm is accumulated to extract a C-K absorption spectrum in the form of average information from a region of about 10 nm, and the sp$^2$/sp$^3$ ratio is calculated.

If the measuring method is used, the sp$^2$/sp$^3$ ratio in a tiny portion can be measured; as the sp$^2$/sp$^3$ ratio of the high-density hard carbon is less than that of the low-density hard carbon, the judgment method of crude density of hard carbon can be substituted.

(7) Measuring Method of Nano Indentation Hardness

The nano indentation hardness is measured using a Nanoindenter ENT1100a manufactured by Elionix Company. When the hardness of each layer of the laminated hard carbon layers is measured, after the cross-section of the film is mirror-polished, an indentation load value is decreased to carry out measurement.

(8) Measuring Method of Electrical Resistance of Columns-Shaped Hard Carbon Layers By the two-terminal method, a fixed current is applied between the terminals and a voltage decrease between two terminals is measured to calculate the electrical resistance value. Specifically, the electrical resistance is calculated by a method in which a tester (multimeter) is used and the electrical resistance ($\Omega$) is obtained by setting a distance between two terminals to 1 cm.

6. Effect of the Implementation Form

As stated above, in the hard carbon film (coating film) of the present invention, the hard carbon layer which has a small sp$^2$/sp$^3$ ratio and is black in the bright-field image of the TEM structure and the hard carbon layer which has a great sp$^2$/sp$^3$ ratio and is white in the bright-field image of the TEM structure are alternately laminated. Besides, the white hard carbon layers have parts that are grown in a columns-shape, and if the white hard carbon layers are specifically observed, the white hard carbon layers are a complicated structure which can be described as columnlike, fiber-like, comb-like, bar-like and so on in the thickness direction.

In addition, when the white hard carbon layers are formed, if the film-forming temperature is not increased to above 250° C., the structure does not become a columns-shape, and the film may be formed in a configuration that the white hard carbon layers having a complicated shape which can be described as mesh-like, scale-like, branch-like have grown in a fan shape in the thickness direction. In the present invention, there are also cases in which such white hard carbon layers are included.

Moreover, the white hard carbon having a small sp$^2$/sp$^3$ ratio is soft and has resistance to impact and excellent low friction property, and thus stress applied externally can be very efficiently dispersed, and low friction property and chipping resistance are excellent.

As a result, chipping resistance and wear resistance can be sufficiently balanced, and low friction properties and peeling resistance are improved. As a result, sliding characteristics can be significantly increased compared with the existing hard carbon film, and chipping resistance and peeling resistance can also be significantly increased compared with the existing hard carbon film. Besides, because black and white hard carbon layers can be repeatedly alternated and laminated to form thick film, durability is also excellent. It is particularly suitable for use in automobile parts such as a piston ring, a piston pin, a gear, a bearing, a valve lifter and common mechanical parts such as a vane and a bearing.

EXAMPLES

Next, the present invention is more specifically described according to examples.

[1] Experiment 1

1. Manufacturing of Test Sample
(1) Forming of Substrate and Intermediate Layer

A substrate (in line with a material of SWOSC-V) was prepared, to form a piston ring shape with a diameter of 80 mm, a ring radial-direction width (a1) of 2.6 mm, a ring width-direction width (h1) of 1.2 mm, grinding was carried out after a CrN layer having a thickness of 10 μm coated the surface of the sliding plane using an arc PVD apparatus, and a CrN layer coated steel substrate having surface roughness Rz of 0.3 μm was prepared.

(2) Forming of Coating Film (a) Example 1

In example 1, an arc PVD apparatus provided with the furnace 11 shown in FIG. 5A for film-forming is used to form a hard carbon film with a total film thickness of 7.6 μm on the surface of the substrate 21 by a method similar to the coating film manufacturing method of the above implementation form.

Specifically, after the substrate on which a CrN layer is formed is disposed on the rotating and revolving fixture 14 which is also a substrate supporting device, set the substrate in the furnace 11 of the arc PVD apparatus and coat metal Cr layer with a thickness of 0.1 μm as an intermediate layer, then use a graphite cathode to start forming a hard carbon film.

At this point, the substrate 21 is made to rotate at a speed of 39 rpm and revolve at a speed of 4 rpm. Besides, regarding the temperature condition during film-forming, after arc discharge is carried out at a bias voltage of −700 V and an arc current of 40 A for 10 minutes, bias voltage −170 V, arc discharge is carried out at a bias voltage of −170 V and an arc current of 40 A to increase the temperature to a temperature range of more than 50° C. and below 200° C. for 1200 seconds to form a black hard carbon layer with a film thickness of 0.2 mm. After that, arc discharge is carried out at a bias voltage of −350 V and an arc current of 40 A to form a black hard carbon layer with a film thickness of 0.15 μm in a temperature range of more than 200° C. and less than 250° C. while heater heating is carried out, and to form a white hard carbon layer with a film thickness of 0.15 μm in a temperature range of 250° C. to 290° C. while heater heating is carried out. The black hard carbon layers formed in this step is 0.35 μm, and the white hard carbon layer formed is 0.15 μm, making a total film thickness of 0.5 μm. After that, arc discharge is stopped at a bias voltage of 0 V and an arc current of 0 A to cool to 125° C. for 4800 seconds. After that, arc discharge is carried out at a bias voltage of −1000 V and an arc current of 40 A for 90 seconds to form an adhesion layer including white hard carbon, then arc discharge is carried out again at a bias voltage of −170 V and an arc current of 40 A to increase the temperature to a temperature range of more than 50° C. and less than 200° C. for 1200 seconds to form a black hard carbon layer with a film thickness of 0.2 μm. Then, arc discharge is carried out at a bias voltage of −350 V and an arc current of 40 A to form a black hard carbon layer with a film thickness of 0.15 μm in a temperature range of more than 200° C. and less than 250° C. while heater heating is carried out, and to form a white hard carbon layer with a film thickness of 0.15 μm in a temperature range of 250° C. to 290° C. while heater heating is carried out. Similar to the above step, the black hard carbon layer is 0.35 μm, the white hard carbon layer is 0.15 μm, and the hard carbon layer including the two layers has a total film thickness of 0.5 μm. The repeating cycle of temperature increase and cooling in which the hard carbon layer is coated is carried out 14 times to form a hard carbon film with a total film thickness of 7.6 μm.

(b) Comparative Example 1

In the comparative example 1, the existing PVD method is used and arc discharge is carried out at a bias voltage of −75 V and an arc current of 40 A for 80 minutes to form a hard carbon film with a thickness of 1.0 μm on the surface of the substrate 21.

(c) Comparative Example 2

In the comparative example 2, except that the film-forming time is changed from 80 minutes in the comparative example 1 to 96 minutes, and the film-forming thickness is set to 1.2 μm, a hard carbon film is formed similarly as the comparative example 1.

(d) Comparative Example 3

In the comparative example 3, the existing CVD method is used and a hard carbon film with a thickness of 7.5 μm is formed on the surface of the substrate 21. In addition, the total film-forming time is set to 130 minutes.

2. Evaluation of Coating Film

Observe the structure of the coating films obtained in the example and comparative example 1 to comparative example 3 and measure the film thickness of the coating film to evaluate wear resistance, chipping resistance, low friction, and peeling resistance respectively. In addition, except the comparative example 3 which uses methane (hydrocarbon gas) in raw material gas, the hydrogen content in other coating films are all below 10 atom %.

(1) Structure and Properties of Coating Film

Take an image of each formed coating film by a bright-field TEM with an acceleration voltage of 200-300 kV, observe the structure of each coating film and measures the film thickness of each coating film.

Besides, the $sp^2/sp^3$ ratio of the black layers and the white layers, the electrical resistance of the uppermost layer, the crystal nature and the orientation of the (002) surfaces obtained by the electron beam diffraction, are measured. In addition, evaluation of the crystal nature and the orientation of the (002) surfaces obtained by the electron beam diffraction are performed for the white columns-shaped hard carbon layers. The measuring results of these measurements are shown in table 1.

Figure 7:
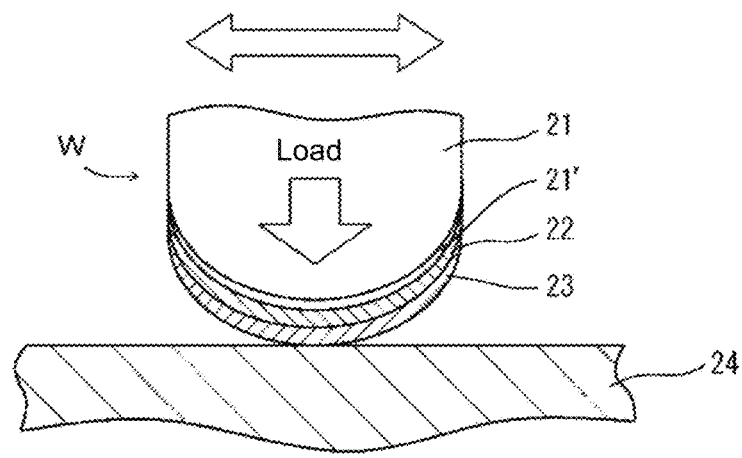
FIG. 7 is a diagram that schematically indicates a friction-wear testing method.

(2) Evaluation of Wear Resistance, Chipping Resistance, Low Friction, Peeling Resistance, and Durability Next, use each formed coating film to conduct a friction-wear testing by a SRV (Schwingungs Reihungund and Verschleiss) experiment machine commonly used in the evaluation of sliding members for automobile. Specifically, as shown in FIG. 7, in the state that the sliding surface of a friction-wear testing sample W contacts with SUJ2 material 24 which is a sliding object, use 5W-30 (Mo-DTC free) for the lubricant oil and apply a load of 100-1000 N (increment of 100 N), slide back and forth for 10 minutes under each load and observe the sliding surface of the friction-wear testing sample W by a microscope. Then, obtain from the observation result the load under which damage is present in each coating film. Besides, calculate the friction coefficient under the load. In addition, in FIG. 7, the symbol 21' is CrN, the symbol 22 is the intermediate layer, and the symbol 23 is the coating film.

Figure 8:
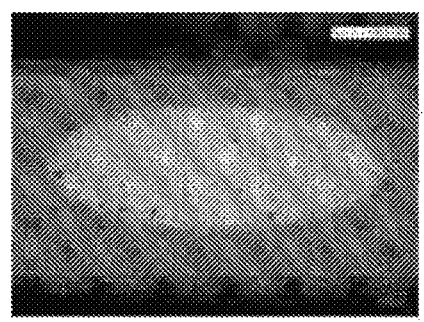
FIG. 8 is a microscope photo that indicates a friction-wear testing result of example 1.
Figure 9:
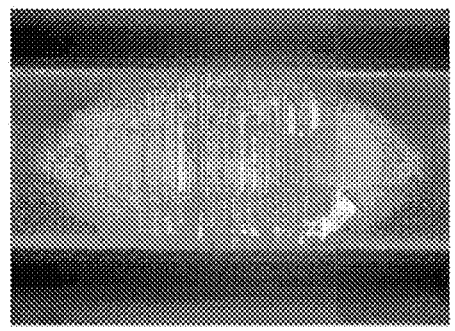
FIG. 9 is a microscope photo that indicates a friction-wear testing result of comparative example 1.

The result of each evaluation is shown in table 1. Besides, the friction-wear testing results of the example 1 and the comparative example 1 are shown in FIG. 8 and FIG. 9 respectively. In addition, in the comparative example 2, during film-forming, the coating film is already self-destructed, thus the evaluation by SRV experiment machine is not conducted.

under 100 N, 200 N, and evaluation can be conducted under normal wear, but as shown in FIG. 9, under a load of 300 N, the film is stripped or chipped and the substrate is exposed, the evaluation is ended under this load. According to the test result, it can be confirmed that, in a coating film with black hard carbon layers only, chipping resistance and peeling resistance is not good, and durability is also insufficient.

Besides, in the comparative example 2 which sets the film thickness to 1.2 μm, internal destruction occurs during film-forming and the film is self-destructed, even without setting the film to the SRV experiment machine can it be confirmed that durability (service life) is low. Furthermore, in the comparative example 3 which sets the film thickness to 7.5 μm in the CVD method, no peeling or chipping occurs under 100N, and evaluation can be conducted under normal

TABLE 1

|  | Example 1 | Comparative example 1 | Comparative example 2 | Comparative example 3 |
|---|---|---|---|---|
| Structure of the coating film | Black layers and white layers are alternately laminated, and the outermost surface layer is a white layer | Black layer only | Black layer only | White layer only |
| Number of laminated layers | Black layer 15 White layer 15 | Black layer 1 | Black layer 1 | White layer 1 |
| Total thickness of the coating film (μm) | 7.6 μm | 1.0 μm | 1.2 μm (self-destructed) | 7.5 μm |
| White hard carbon layers grown in a columns-shape in the thickness direction | Existing | None | None | None |
| $sp^2/sp^3$ ratio | 0.3 for the black layer, 0.7 for the white layer | 0.2 for the black layer | 0.2 for the black layer | 0.5 for the white layer |
| Electron beam diffraction | Diffraction spots are detected at positions with a lattice spacing of 0.3-0.4 nm | — | — | Diffraction spots are detected at positions with a lattice spacing of 0.3-0.4 nm |
| Orientation of (002) surfaces | Horizontal direction relative to the substrate | — | — | None |
| Electrical resistance | 5-20 Ω · cm | 10 KΩ · cm | — | 6 MΩ · cm |
| Load under which peeling or chipping is generated | Not generated even under 1000N and is able to continue | 300N | — | 200N |
| Low friction properties (friction coefficient) | 0.07 | 0.08 | — | 0.09 |

According to table 1, it is confirmed that, in the example 1, a coating film with a film thickness of 7.6 μm and without internal destruction can be formed, and as shown in FIG. 8, normal surface shape is maintained even after 10 minutes of SRV test under a high load of 1000 N; therefore, by alternately laminating the black hard carbon layers and the white hard carbon layers and forming a coating film which has white hard carbon layers grown in a fan shape in the thickness direction, a thick coating film, which has a thickness above 1 μm and good wear resistance, chipping resistance, peeling resistance, durability and low friction properties, can be provided.

In contrast, in the comparative example 1 which sets the film thickness to 1.0 μm, no peeling or chipping occurs wear, but under a load of 200 N, the film is stripped or chipped and the substrate is exposed, the evaluation is ended under this load.

[2] Experiment 2

1. Example 2-Example 19

According to the result of the experiment 1, it can be confirmed that when the black hard carbon layers and the white hard carbon layers are laminated to form a coating film, wear resistance, chipping resistance, low friction properties, peeling resistance and durability (service life) is good; therefore, in the experiment 2 below, various film-forming conditions are changed, and the $sp^2/sp^3$ ratio of the black hard carbon layer, the $sp^2/sp^3$ ratio of the white hard carbon layer, the thickness of the black hard carbon layer and the thickness of the white hard carbon layer are made to be different respectively to form coating films of examples 2-19 as shown in Table 2, so that hard carbon layers are formed that in the structure where the black layers and the white layers are alternately laminated as in the example 1, the outermost surface layer is the white layer, and the total film thickness is 4.8-5.8 μm.

TABLE 2

| | $sp^2/sp^3$ ratio | | Thickness (nm) | | Laminating number of black and white hard carbon layers | Total film thickness (μm) |
|---|---|---|---|---|---|---|
| | Black hard carbon layers | White hard carbon layers | Black hard carbon layers | White hard carbon layers | | |
| Example 2 | 0.07 | 0.7 | 300 | 300 | 8 | 5.0 |
| Example 3 | 0.1 | 0.7 | 300 | 300 | 8 | 5.0 |
| Example 4 | 0.25 | 0.7 | 300 | 300 | 8 | 5.0 |
| Example 5 | 0.4 | 0.7 | 300 | 300 | 8 | 5.0 |
| Example 6 | 0.45 | 0.7 | 300 | 300 | 8 | 5.0 |
| Example 7 | 0.2 | 0.4 | 300 | 300 | 8 | 5.0 |
| Example 8 | 0.2 | 0.45 | 300 | 300 | 8 | 5.0 |
| Example 9 | 0.2 | 0.8 | 300 | 300 | 8 | 5.0 |
| Example 10 | 0.2 | 0.85 | 300 | 300 | 8 | 5.0 |
| Example 11 | 0.2 | 0.9 | 300 | 300 | 8 | 5.0 |
| Example 12 | 0.3 | 0.7 | 5 | 300 | 16 | 5.0 |
| example 13 | 0.3 | 0.7 | 20 | 300 | 16 | 5.1 |
| Example 14 | 0.3 | 0.7 | 1000 | 300 | 4 | 5.4 |
| Example 15 | 0.3 | 0.7 | 1100 | 300 | 4 | 5.8 |
| Example 16 | 0.3 | 0.7 | 300 | 5 | 16 | 5.0 |
| Example 17 | 0.3 | 0.7 | 300 | 20 | 16 | 5.1 |
| Example 18 | 0.3 | 0.7 | 300 | 2000 | 2 | 4.8 |
| Example 19 | 0.3 | 0.7 | 300 | 2500 | 2 | 5.8 |

2. Evaluation

Figure 10:
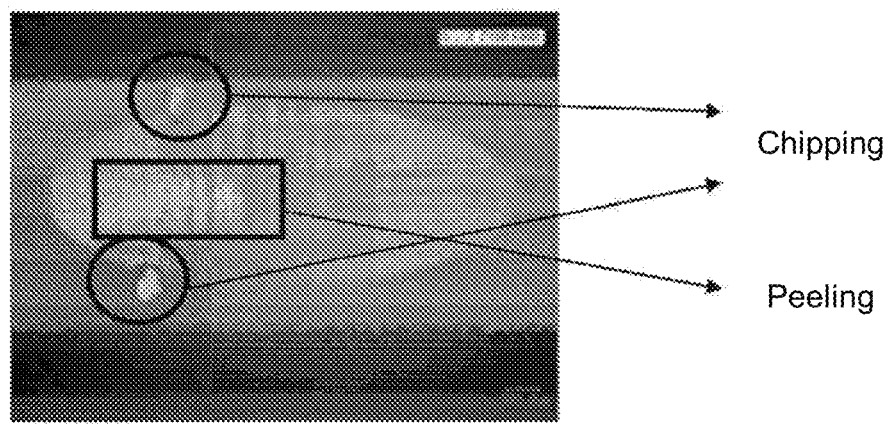
FIG. 10 is a microscope photo that indicates chipping and peeling in the friction-wear testing result.

As for the coating films of example 2-example 19, the method similar to the experiment 1 is used, the films are slid back and forth by the SRV test device under a load of 1000 N for 60 minutes, and the sliding surface of the friction-wear testing sample W is observed by a microscope. Then, chipping resistance and peeling resistance of the coating film are evaluated according to the observation result. Wear resistance is evaluated from wear depth, and low friction property are evaluated by measuring the friction coefficient value. The evaluation result is shown in Table 3. A photo of a real coating film for which peeling and chipping occur during the SRV test is shown in FIG. 10.

In addition, the evaluation references in each evaluation are as follows.

(1) Wear Resistance

It is evaluated as "excellent" when the total wear amount is within ¼ of the total film thickness, as "good" when over ¼ but within ½, as "qualified" when the base is not exposed and the wear amount is above ½ of the total film thickness, and as "unqualified" when the wear amount is above the total film thickness and the base is exposed.

(2) Chipping Resistance

It is evaluated as "excellent" when there is no chipping, as "good" when there are 1-4 points of tiny chipping, as "qualified" when there is more than 5 tiny chipping, and as "unqualified" when the chipping is above 0.05 mm.

(3) Peeling Resistance

It is evaluated as "excellent" when there is no peeling, "good" when the total peeling amount is within ⅛ of the total sliding area, as "qualified" when within ¼, and as "unqualified" when the peeling is over ¼.

TABLE 3

| | Wear resistance | Chipping resistance | Low friction property | Peeling resistance |
|---|---|---|---|---|
| Example 2 | Excellent | Qualified | 0.07 | Good |
| Example 3 | Excellent | Good | 0.07 | Excellent |

TABLE 3-continued

| | Wear resistance | Chipping resistance | Low friction property | Peeling resistance |
|---|---|---|---|---|
| Example 4 | Excellent | Excellent | 0.07 | Excellent |
| Example 5 | Excellent | Excellent | 0.07 | Excellent |
| Example 6 | Qualified | Excellent | 0.07 | Excellent |
| Example 7 | Excellent | Qualified | 0.08 | Good |
| Example 8 | Excellent | Excellent | 0.07 | Excellent |
| Example 9 | Excellent | Excellent | 0.06 | Excellent |
| Example 10 | Good | Excellent | 0.06 | Excellent |
| Example 11 | Qualified | Excellent | 0.06 | Excellent |
| Example 12 | Qualified | Excellent | 0.07 | Excellent |
| Example 13 | Good | Excellent | 0.07 | Excellent |
| Example 14 | Excellent | Good | 0.07 | Excellent |
| Example 15 | Excellent | Qualified | 0.07 | Good |
| Example 16 | Excellent | Qualified | 0.07 | Qualified |
| Example 17 | Excellent | Good | 0.07 | Good |
| Example 18 | Good | Excellent | 0.07 | Excellent |
| Example 19 | Qualified | Excellent | 0.07 | Excellent |

According to table 3, when comparing the example 2-example 6 in which the $sp^2/sp^3$ ratios of the black hard carbon layer are made to be different respectively, in the example 2 with a $sp^2/sp^3$ ratio of the black hard carbon layer below 0.1, chipping resistance decreases slightly. Besides, in the example 6 with a $sp^2/sp^3$ ratio of the black hard carbon layer above 0.4, wear resistance decreases slightly. Accordingly, it can be confirmed that the $sp^2/sp^3$ ratio of the black hard carbon layer is preferably 0.1-0.4 as in the example 3-example 5.

Besides, when comparing the example 7-example 11 in which the $sp^2/sp^3$ ratios of the white hard carbon layer are made to be different respectively, in the example 7 with a $sp^2/sp^3$ ratio of the white hard carbon layer below 0.45, chipping resistance decreases slightly, and in the example 11 with a sp²/sp³ ratio above 0.85, wear resistance decreases slightly. Accordingly, it can be confirmed that the sp²/sp³ ratio of the white hard carbon layer is preferably 0.45-0.85 as in the example 8-example 10.

Next, when comparing the example 12-example 15 in which the thickness of the black hard carbon layer is made to be different respectively, it can be confirmed that as in the example 12, when the thickness of the black hard carbon layer is below 20 nm, wear resistance decreases, and it can be confirmed that when the thickness is above 1000 run, chipping resistance decreases. Accordingly, it can be confirmed that the thickness of the black hard carbon layer is preferably 20-1000 nm as in the example 13-example 14.

Then, when comparing the example 16-example 19 in which the thickness of the white hard carbon layer is made to be different respectively, it can be confirmed that, when the white hard carbon layer is too thin, chipping resistance decreases, and when the white hard carbon layer is too thick, wear resistance decreases. Then, it can be confirmed that the thickness of the white hard carbon layer is preferably 20-2000 run as in the example 17-example 18.

[3] Experiment 3

1. Example 20-example 21

In the experiment 3 below, in order that in the structure where the black layer and the white layer are alternately laminated as in the example 1, the outermost surface layer is the white layer and the total film thickness is 8 μm, the coating films of the examples 20-21 as shown in Table 4 are formed in the following manner: nine black layers and nine white layers are alternately laminated, various film-forming conditions are changed, and a ratio of the thickness of the white hard carbon layer to the thickness of the black hard carbon layer changes in the thickness direction of the coating film.

TABLE 4

| | sp²/sp³ ratio | | Thickness (nm) | | |
| --- | --- | --- | --- | --- | --- |
| | Black hard carbon layer | White hard carbon layer | Position in the film thickness direction | Black hard carbon layer | White hard carbon layer |
| Example 20 | 0.3 | 0.7 | Film surface side | 300 | 300 |
| | | | Film middle part | 300 | 300 |
| | | | Film base side | 300 | 300 |
| Example 21 | 0.3 | 0.7 | Film surface side | 150 | 450 |
| | | | Film middle part | 300 | 300 |
| | | | Film base side | 550 | 50 |

2. Evaluation

As for the coating films of the example 20-example 21, the method similar to the experiment 2 is used, the evaluation is conducted by the SRV test device under a load of 1000 N for an evaluation time prolonged for 30 minutes in each example, and wear resistance, low friction properties and durability are evaluated based on the average value in 3 tests. The evaluation result is shown in Table 5. In addition, regarding the durability, the duration time when no chipping or peeling occurs in the test piece is set as the evaluation time.

TABLE 5

| | Wear resistance | Low friction property | Durability |
| --- | --- | --- | --- |
| Example 20 | Excellent | 0.06 | 180 minutes |
| Example 21 | Excellent | 0.06 | No chipping and peeling damage in 360 minutes |

According to Table 5, in the example 21 for which the ratio of the thickness of the white hard carbon layer to the thickness of the black hard carbon layer changes in the thickness direction of the coating film and the value increases from the substrate side toward the surface side, compared with the example 20 in which the ratio of the thickness of the white hard carbon layer to the thickness of the black hard carbon layer does not change, durability increases significantly. Accordingly, it can be confirmed that, in the coating film for which the ratio of the thickness of the white hard carbon layer to the thickness of the black hard carbon layer changes in the thickness direction of the coating film and the value increases from the substrate side toward the surface side, excellent durability can be expected.

[4] Experiment 4

1. Example 22-Example 23

In the experiment 4 below, the coating film of the example 22 is formed, wherein the coating film has a film structure similar to the example 21, and is a hard carbon layer film with a total film thickness of 8 μm which contains 15 atom % of hydrogen in the hard carbon by flowing methane gas in a step of form the hard carbon into a film in a manner that hydrogen is contained in the hard carbon.

2. Evaluation

Then, use the method similar to the experiment 3 to evaluate wear resistance, low friction properties and durability with the coating films of the example 22 containing hydrogen and of the example 21 not containing hydrogen by the SRV test device under a load of 1000 N. However, the test is conducted under the condition that Mo-DTC is contained in the lubricant oil. The evaluation result is shown in Table 6.

TABLE 6

| | Wear resistance | Low friction property | Durability |
| --- | --- | --- | --- |
| Example 21 | Excellent | 0.06 | No chipping and peeling damage in 360 minutes |
| Example 22 | Qualified | 0.06 | 60 minutes |

According to Table 6, in the example 21 in which the hydrogen content of the black hard carbon layer and the white hard carbon layer is below 10 atom %, compared with the example 22 in which the hydrogen content of the black hard carbon layer and the white hard carbon layer is above 10 atom %, durability increases significantly. Accordingly, it can be confirmed that for the coating film in which the hydrogen content in the hard carbon is below 10 atom %, excellent wear resistance and durability can be expected.

Then, the nano indentation hardness of each layer of the hard carbon layers of the example 21 exhibiting excellent sliding performance is evaluated, and the hardness can be confirmed to be the hardness as shown in Table 7.

TABLE 2

| | sp²/sp³ ratio | | | Nano indentation hardness | |
| --- | --- | --- | --- | --- | --- |
| | Black hard carbon layer | White hard carbon layer | | Black hard carbon layer | White hard carbon layer |
| Example 21 | 0.3 | 0.7 | Film surface side | 33 GPa | 10 GPa |
| | | | Film middle part | 50 GPa | 17 GPa |
| | | | Film base side | 64 GPa | 25 GPa |

[5] Experiment 5

1. Example 24

In the experiment 5 below, a coating film of the example 24 is formed, which is a film of hard carbon layers with a total film thickness of 5.3 μm, and in the film-formation step of the example 21, the adhesion layer containing white hard carbon is not formed.

2. Evaluation

Then, use the method similar to the experiment 3 to evaluate wear resistance, low friction properties and durability with the coating film of the example 24 not containing the adhesion layer by the SRV test device under a load of 1000 N.

TABLE 8

| | Wear resistance | Low friction property | Durability |
| --- | --- | --- | --- |
| Example 21 | Excellent | 0.06 | No chipping and peeling damage in 360 minutes |
| Example 24 | Good | 0.06 | 90 minutes |

According to Table 8, in the example 24 not containing the adhesion layer, compared with the example 21 containing the adhesion layer, wear resistance and durability decrease. Accordingly, for the coating film containing the adhesion layer, excellent wear resistance and durability can be expected.

The above describes the present invention according to implementation forms, but the present invention is not limited to the implementation forms. Various changes can be made to the implementation forms within the same and equivalent scopes of the present invention.

What is claimed is:

1. A coating film, coated on a substrate surface, wherein when a cross-section is observed through a bright-field TEM image, white hard carbon layers shown as relatively white and black hard carbon layers shown as black are alternately laminated in a thickness direction to have a total film thickness ranging from 1 μm to 50 μm, and the white hard carbon layers have regions that are grown in a columns-shape in the thickness direction, wherein the columns-shape have structures that (002) surfaces are in parallel with the substrate, and a c-axis grows perpendicular to the substrate.

2. The coating film according to claim 1, further comprising an adhesion layer comprising relatively-white hard carbon in between the white hard carbon layer shown as relatively white and the black hard carbon layer shown as black when the cross-section is observed through the bright-field TEM image.

3. The coating film according to claim 2, wherein a sp²/sp³ ratio of the adhesion layer comprising the white hard carbon is 0.4-0.9.

4. The coating film according to claim 1, wherein a sp²/sp³ ratio of the black hard carbon layer is 0.1-0.45.

5. The coating film according to claim 1, wherein a sp²/sp³ ratio of the white hard carbon layer is 0.45-0.85.

6. The coating film according to claim 1, wherein when electron beam diffraction is performed to the white hard carbon layers, diffraction spots are shown at positions with a lattice spacing of 0.3-0.4 nm, and the (002) surfaces are aligned so as to become a direction of lamination on the substrate.

7. The coating film according to claim 1, wherein an electrical resistance on the coating film surface of a member having the coating film is 0.1-1000 Ω.

8. The coating film according to claim 1, wherein a thickness of each layer of the white hard carbon layers is 20-2000 nm, and a thickness of each layer of the black hard carbon layers is 20-1000 nm.

9. The coating film according to claim 8, wherein a ratio of the thickness of the white hard carbon layer to the thickness of the black hard carbon layer changes in the thickness direction of the coating film, and increases from the substrate side toward a surface side.

10. The coating film according to claim 1, wherein a hydrogen content of the black and/or the white hard carbon layers is below 10 atom %.

11. The coating film according to claim 1, wherein at least one layer of the white hard carbon layers exists in a region within a depth of 1 μm from the surface, and the sp²/sp³ ratio of the white hard carbon layer is above 0.5.

12. The coating film according to claim 1, wherein an outermost surface is the white hard carbon layer.

13. The coating film according to claim 1, wherein a nano indentation hardness of the black hard carbon layers is 30-80 GPa.

14. The coating film according to claim 13, wherein a nano indentation hardness of the white hard carbon layers is 10-30 GPa.

* * * * *